United States Patent
Lee et al.

(10) Patent No.: US 12,176,437 B2
(45) Date of Patent: *Dec. 24, 2024

(54) THIN-FILM TRANSISTOR INCLUDING OXIDE SEMICONDUCTOR LAYER, METHOD OF MANUFACTURING THE SAME, AND DISPLAY APPARATUS INCLUDING THE SAME

(71) Applicant: LG Display Co., Ltd., Seoul (KR)

(72) Inventors: HeeSung Lee, Incheon (KR); SungKi Kim, Seoul (KR); MinCheol Kim, Paju-si (KR); SeungJin Kim, Paju-si (KR); JeeHo Park, Seoul (KR); Seoyeon Im, Paju-si (KR)

(73) Assignee: LG Display Co., Ltd., Seoul (KR)

(*) Notice: Subject to any disclaimer, the term of this patent is extended or adjusted under 35 U.S.C. 154(b) by 464 days.

This patent is subject to a terminal disclaimer.

(21) Appl. No.: 17/524,255

(22) Filed: Nov. 11, 2021

(65) Prior Publication Data

US 2022/0069130 A1 Mar. 3, 2022

Related U.S. Application Data

(62) Division of application No. 16/790,591, filed on Feb. 13, 2020, now Pat. No. 11,201,248, which is a
(Continued)

(30) Foreign Application Priority Data

Jun. 27, 2017 (KR) .................. 10-2017-0081022
Oct. 20, 2017 (KR) .................. 10-2017-0136199

(51) Int. Cl.
*H01L 29/786* (2006.01)
*G02F 1/1335* (2006.01)
(Continued)

(52) U.S. Cl.
CPC .... *H01L 29/7869* (2013.01); *G02F 1/133514* (2013.01); *G02F 1/134309* (2013.01);
(Continued)

(58) Field of Classification Search
CPC ............. G02F 1/133514; G02F 1/1335; G02F 1/1343; G02F 1/1368; G02F 1/133357;
(Continued)

(56) References Cited

U.S. PATENT DOCUMENTS 8,232,552 B2    7/2012  Yano et al.
9,343,586 B2 *  5/2016  Goto ....................... C23C 14/08
(Continued)

FOREIGN PATENT DOCUMENTS

CN      101263605 A      9/2008
CN      102812150 A      12/2012
(Continued)

OTHER PUBLICATIONS

Park et al., "High-performance amorphous gallium indium zinc oxide thin-film transistor through $N_2O$ plasma passivation," *Appl. Phys. Lett.* 93(5):053505-1 to 053505-3, Aug. 7, 2008.

*Primary Examiner* — Nikolay K Yushin
(74) *Attorney, Agent, or Firm* — Seed IP Law Group LLP

(57) ABSTRACT

A thin-film transistor is disclosed. The thin-film transistor includes a gate electrode disposed on a substrate, an oxide semiconductor layer disposed so as to overlap at least a portion of the gate electrode in the state of being isolated from the gate electrode, a gate insulation film disposed between the gate electrode and the oxide semiconductor layer, a source electrode connected to the oxide semiconductor layer, and a drain electrode connected to the oxide semiconductor layer in the state of being spaced apart from the source electrode, wherein the oxide semiconductor layer includes indium (In), gallium (Ga), zinc (Zn), tin (Sn), and
(Continued)

oxygen (O), the content of indium (In) in the oxide semiconductor layer is greater than the content of gallium (Ga), the content of indium (In) is substantially equal to the content of zinc (Zn), and the content ratio (Sn/In) of tin (Sn) to indium (In) is 0.1 to 0.25.

20 Claims, 21 Drawing Sheets

Related U.S. Application Data division of application No. 16/019,294, filed on Jun. 26, 2018, now Pat. No. 10,608,117.

(51) Int. Cl.
| | | |
|---|---|---|
| *G02F 1/1343* | (2006.01) | |
| *G02F 1/1368* | (2006.01) | |
| *H01L 27/12* | (2006.01) | |
| *H01L 29/66* | (2006.01) | |
| *H10K 59/121* | (2023.01) | |
| *H10K 59/122* | (2023.01) | |
| *H10K 59/38* | (2023.01) | |
| *G02F 1/1333* | (2006.01) | |

(52) U.S. Cl.
CPC ........ *G02F 1/1368* (2013.01); *H01L 27/1225* (2013.01); *H01L 29/66742* (2013.01); *H01L 29/78696* (2013.01); *H10K 59/1213* (2023.02); *H10K 59/122* (2023.02); *H10K 59/38* (2023.02); *G02F 1/133357* (2021.01); *G02F 1/13685* (2021.01)

(58) Field of Classification Search
CPC ............... G02F 1/1333; G02F 1/13685; G02F 1/134309; H01L 27/1225; H01L 27/12; H01L 27/1222; H01L 27/1233; H01L 29/7869; H01L 29/786; H01L 29/66742; H01L 29/66; H01L 29/78696; H01L 29/78612; H01L 29/78621; H01L 29/66969; H10K 59/1213; H10K 59/121; H10K 59/122; H10K 59/38
See application file for complete search history.

(56) References Cited

U.S. PATENT DOCUMENTS

| | | |
|---|---|---|
| 2011/0273410 A1 | 11/2011 | Park et al. |
| 2013/0009209 A1 | 1/2013 | Yamazaki |
| 2013/0009219 A1 | 1/2013 | Yamazaki et al. |
| 2013/0099229 A1 | 4/2013 | Wakana et al. |
| 2013/0161608 A1 | 6/2013 | Yamazaki |
| 2013/0228775 A1 | 9/2013 | Noda et al. |
| 2014/0138674 A1 | 5/2014 | Sato et al. |
| 2014/0299874 A1 | 10/2014 | Yamazaki |
| 2015/0034950 A1 | 2/2015 | Miyazawa et al. |
| 2015/0060990 A1 | 3/2015 | Kim et al. |
| 2015/0076488 A1 | 3/2015 | Kishi et al. |
| 2015/0076489 A1 | 3/2015 | Morita et al. |
| 2015/0091000 A1 | 4/2015 | Morita et al. |
| 2015/0091002 A1 | 4/2015 | Hayashi et al. |
| 2015/0123116 A1 | 5/2015 | Goto et al. |
| 2015/0255627 A1 | 9/2015 | Goto et al. |
| 2015/0295058 A1 | 10/2015 | Morita et al. |
| 2015/0318400 A1 | 11/2015 | Morita et al. |
| 2016/0079437 A1 | 3/2016 | Ochi et al. |
| 2016/0315201 A1 | 10/2016 | Lee et al. |
| 2017/0069784 A1 | 3/2017 | Peng et al. |
| 2018/0307073 A1 | 10/2018 | Liu et al. |
| 2018/0350995 A1 | 12/2018 | Kim et al. |
| 2019/0051758 A1 | 2/2019 | Ochi et al. |
| 2019/0123149 A1 | 4/2019 | Lee et al. |
| 2019/0140101 A1 | 5/2019 | Im et al. |

FOREIGN PATENT DOCUMENTS

| | | |
|---|---|---|
| CN | 102867854 A | 1/2013 |
| CN | 103824886 A | 5/2014 |
| CN | 103999228 A | 8/2014 |
| CN | 104335354 A | 2/2015 |
| CN | 104425611 A | 3/2015 |
| JP | 2007-281409 A | 10/2007 |
| JP | 2010-028021 A | 2/2010 |
| JP | 2010-040552 A | 2/2010 |
| JP | 2010-272663 A | 12/2010 |
| JP | 2011-108873 A | 6/2011 |
| JP | 2011-222767 A | 11/2011 |
| JP | 2013-038399 A | 2/2013 |
| JP | 2013-149965 A | 8/2013 |
| JP | 2013-211544 A | 10/2013 |
| JP | 2014-116588 A | 6/2014 |
| JP | 2014-212309 A | 11/2014 |
| JP | 2014-214359 A | 11/2014 |
| JP | 2014-229638 A | 12/2014 |
| JP | 2014-229666 A | 12/2014 |
| JP | 2014-232870 A | 12/2014 |
| JP | 2015-033026 A | 2/2015 |
| JP | 2015-070223 A | 4/2015 |
| JP | 2015-097272 A | 5/2015 |
| JP | 2017-157813 A | 9/2017 |
| JP | 2019-160829 A | 9/2019 |
| KR | 10-2008-0058406 A | 6/2008 |
| KR | 10-1058880 B1 | 8/2011 |
| KR | 10-2013-0006344 A | 1/2013 |
| KR | 10-2014-0063444 A | 5/2014 |
| KR | 10-2014-0107451 A | 9/2014 |
| KR | 10-2014-0123428 A | 10/2014 |
| KR | 10-2014-0131264 A | 11/2014 |
| KR | 10-2015-0027164 A | 3/2015 |
| KR | 10-2015-0029035 A | 3/2015 |
| KR | 10-2015-0087411 A | 7/2015 |
| KR | 10-1621644 B1 | 5/2016 |
| KR | 10-2016-0098360 A | 8/2016 |
| KR | 10-1648661 B1 | 8/2016 |
| KR | 10-1648684 B1 | 8/2016 |
| KR | 10-2017-0030433 A | 3/2017 |
| KR | 10-2017-0071780 A | 6/2017 |
| KR | 10-2018-0049780 A | 5/2018 |
| TW | 201407791 A | 2/2014 |
| WO | 2007/032294 A1 | 3/2007 |
| WO | 2011/132769 A1 | 10/2011 |
| WO | 2015/064468 A1 | 5/2015 |
| WO | 2016/175034 A1 | 11/2016 |

\* cited by examiner

THIN-FILM TRANSISTOR INCLUDING OXIDE SEMICONDUCTOR LAYER, METHOD OF MANUFACTURING THE SAME, AND DISPLAY APPARATUS INCLUDING THE SAME

BACKGROUND

Technical Field

The present disclosure relates to a thin-film transistor including an oxide semiconductor layer, a method of manufacturing the thin-film transistor, and a display apparatus including the thin-film transistor.

Description of the Related Art

In the field of electronic equipment, a transistor has been widely used as a switching device or a driving device. In particular, a thin-film transistor has been widely used as a switching device of a display apparatus, such as a liquid crystal display apparatus or an organic light-emitting display apparatus, since the thin-film transistor can be manufactured on a glass substrate or a plastic substrate.

Based on a material constituting an active layer, the thin-film transistor may be classified as an amorphous silicon thin-film transistor, in which amorphous silicon is used as the active layer, a polycrystalline silicon thin-film transistor, in which polycrystalline silicon is used as the active layer, or an oxide semiconductor thin-film transistor, in which an oxide semiconductor is used as the active layer.

The amorphous silicon thin-film transistor (a-Si TFT) has advantages in that manufacturing time is short and the manufacturing cost is low, since the amorphous silicon is deposited within a short time in order to form the active layer. However, the amorphous silicon thin-film transistor has disadvantages in that the amorphous silicon thin-film transistor has low mobility, for example Hall mobility, whereby the current-driving ability of the amorphous silicon thin-film transistor is not good, and that the threshold voltage of the amorphous silicon thin-film transistor is changed, whereby the use of the amorphous silicon thin-film transistor in an active matrix organic light-emitting device (AMOLED) is limited.

The polycrystalline silicon thin-film transistor (poly-Si TFT) is manufactured by depositing and crystallizing amorphous silicon. Since the process of crystallizing amorphous silicon is required in order to manufacture the polycrystalline silicon thin-film transistor, the number of processes is increased, with the result that manufacturing cost is increased. In addition, since the crystallizing process is performed at a high process temperature, it is difficult to apply the polycrystalline silicon thin-film transistor to a large-sized apparatus. Furthermore, it is difficult to secure the uniformity of the polycrystalline silicon thin-film transistor due to the polycrystalline properties thereof.

For the oxide semiconductor thin-film transistor (oxide semiconductor TFT), an oxide constituting the active layer may be deposited at a relatively low temperature, the mobility of the oxide semiconductor thin-film transistor is high, and a change in the resistance of the oxide is great depending on the content of oxygen, whereby desired physical properties of the oxide semiconductor thin-film transistor are easily obtained. In addition, the oxide semiconductor thin-film transistor is advantageous in the realization of a transparent display, since the oxide semiconductor is transparent due to the properties of the oxide. The oxide semiconductor is made of a zinc oxide (ZnO), an indium zinc oxide (InZnO), or an indium gallium zinc oxide ($InGaZnO_4$).

Prior techniques have been described in various publications, so for example, Korean Patent Application Publication No. 10-2015-0027164 entitled THIN-FILM TRANSISTOR and Korean Patent Application Publication No. 10-2016-0098360 entitled THIN-FILM TRANSISTOR.

BRIEF SUMMARY

The present disclosure has been made in view of the above problems, and it is an object of the present disclosure to provide a thin-film transistor including an oxide semiconductor layer that includes tin (Sn) and exhibits excellent mobility and reliability.

It is another object of the present disclosure to provide a thin-film transistor including an oxide semiconductor layer that has a predetermined thickness and is formed by deposition and heat treatment at a predetermined temperature, whereby the thin-film transistor exhibits excellent ability to withstand heat and light.

It is a further object of the present disclosure to provide a method of manufacturing the thin-film transistor described above and a display apparatus including the thin-film transistor described above.

In accordance with an aspect of the present disclosure, the above and other objects can be accomplished by the provision of a thin-film transistor including a gate electrode disposed on a substrate, an oxide semiconductor layer disposed so as to overlap at least a portion of the gate electrode in the state of being isolated from the gate electrode, a gate insulation film disposed between the gate electrode and the oxide semiconductor layer, a source electrode connected to the oxide semiconductor layer, and a drain electrode connected to the oxide semiconductor layer in the state of being spaced apart from the source electrode, wherein the oxide semiconductor layer includes indium (In), gallium (Ga), zinc (Zn), tin (Sn), and oxygen (O), the content of indium (In) in the oxide semiconductor layer is greater than the content of gallium (Ga), the content of indium (In) is substantially equal to the content of zinc (Zn), and the content ratio (Sn/In) of tin (Sn) to indium (In) is 0.1 to 0.25.

The oxide semiconductor layer may have a thickness of 20 nm or more. The oxide semiconductor layer may have C-axis-oriented crystallinity. The oxide semiconductor layer may have a mobility of 18 $cm^2/V \cdot s$ or more. The oxide semiconductor layer may have a carrier concentration of $5 \times 10^{17}$ $EA/cm^3$ or more.

The oxide semiconductor layer may have a packing density of 6.5 $g/cm^3$ or more. The oxide semiconductor layer may have a spin density of $2.0 \times 10^{17}$ $spins/cm^3$ or less. The oxide semiconductor layer may have a spin density of $1.5 \times 10^{17}$ $spins/cm^3$ or more. The oxide semiconductor layer may have a first layer and a second layer, which are sequentially stacked, and the oxygen (O) content of the second layer may be greater than the oxygen (O) content of the first layer.

The second layer may have a thickness equivalent to 5 to 20% of the thickness of the oxide semiconductor layer. The second layer may have an oxygen content equivalent to 1.2 to 2.5 times the oxygen content of the first layer. The thickness of the region of the second layer that does not overlap the source electrode and the drain electrode may be greater than the thickness of the region of the second layer that overlaps at least one of the source electrode or the drain electrode.

In accordance with another aspect of the present disclosure, there is provided a method of manufacturing a thin-film transistor, including forming a gate electrode on a substrate, forming an oxide semiconductor layer that overlaps at least a portion of the gate electrode in the state of being isolated from the gate electrode, forming a gate insulation film for isolating the gate electrode and the oxide semiconductor layer from each other, and forming a source electrode and a drain electrode connected to the oxide semiconductor layer, the source electrode and the drain electrode being disposed so as to be spaced apart from each other, wherein the oxide semiconductor layer includes indium (In), gallium (Ga), zinc (Zn), tin (Sn), and oxygen (O), the content of indium (In) in the oxide semiconductor layer is greater than the content of gallium (Ga), the content of indium (In) is substantially equal to the content of zinc (Zn), and the content ratio (Sn/In) of tin (Sn) to indium (In) is 0.1 to 0.25.

The oxide semiconductor layer may be formed by deposition, and the deposition may be performed at a temperature of 150° C. or higher. The oxide semiconductor layer may have a thickness of 20 nm or more.

The method may further include plasma-treating the oxide semiconductor layer. $N_2O$ may be used at the step of plasma-treating the oxide semiconductor layer. Energy of an amount ranging from 2.0 to 2.5 $kW/m^2$ may be applied at the step of plasma-treating the oxide semiconductor layer.

The method may further include heat-treating the oxide semiconductor layer at a temperature of 300° C. or higher after the step of forming the oxide semiconductor layer is performed.

The gate electrode, the gate insulation film, and the oxide semiconductor layer may be sequentially formed on the substrate. The oxide semiconductor layer, the gate insulation film, and the gate electrode may be sequentially formed on the substrate.

In accordance with a further aspect of the present disclosure, there is provided a display apparatus including a substrate, a thin-film transistor disposed on the substrate, and a first electrode connected to the thin-film transistor, wherein the thin-film transistor includes a gate electrode disposed on the substrate, an oxide semiconductor layer disposed so as to overlap at least a portion of the gate electrode in the state of being isolated from the gate electrode, a gate insulation film disposed between the gate electrode and the oxide semiconductor layer, a source electrode connected to the oxide semiconductor layer, and a drain electrode connected to the oxide semiconductor layer in the state of being spaced apart from the source electrode, wherein the oxide semiconductor layer includes indium (In), gallium (Ga), zinc (Zn), tin (Sn), and oxygen (O), the content of indium (In) in the oxide semiconductor layer is greater than the content of gallium (Ga), the content of indium (In) is substantially equal to the content of zinc (Zn), and the content ratio (Sn/In) of tin (Sn) to indium (In) is 0.1 to 0.25.

The display apparatus may further include an organic layer disposed on the first electrode, the organic layer including an organic light-emitting layer, and a second electrode disposed on the organic layer.

The display apparatus may further include a liquid crystal layer disposed on the first electrode and a second electrode disposed on the liquid crystal layer.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION DISCLOSURE

Figure 1:
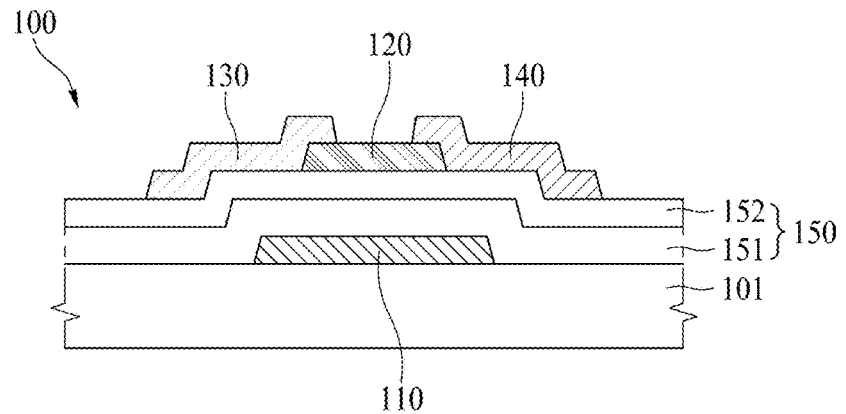
FIG. 1 is a cross-sectional view of a thin-film transistor according to an embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, a thin-film transistor, a method of manufacturing the same, and a display apparatus including the same according to embodiments of the present disclosure will be described in detail with reference to the accompanying drawings. In the drawings, the same or similar elements are denoted by the same reference numerals even though they are depicted in different drawings.

FIG. 1 is a schematic cross-sectional view of a thin-film transistor 100 according to an embodiment of the present disclosure.

The thin-film transistor 100 according to the embodiment of the present disclosure includes a gate electrode 110 disposed on a substrate 101, an oxide semiconductor layer 120 disposed so as to overlap at least a portion of the gate electrode 110 in the state of being isolated from the gate electrode 110, a gate insulation film 150 disposed between the gate electrode 110 and the oxide semiconductor layer 120, a source electrode 130 connected to the oxide semiconductor layer 120, and a drain electrode 140 connected to the oxide semiconductor layer 120 in the state of being spaced apart from the source electrode 130.

Glass or plastic may be used as the substrate 101. Transparent plastic that exhibits flexibility, such as polyimide, may be used as the plastic.

In the case in which polyimide is used as the substrate 101, heat-resistant polyimide, which withstands high temperatures, may be used in consideration of the fact that a high-temperature deposition process is carried out on the substrate 101. In this case, processes, such as deposition and etching, may be carried out in the state in which the polyimide substrate is disposed on a carrier substrate composed of a highly durable material, such as glass, in order to form the thin-film transistor 100.

A buffer layer (not shown) may be disposed on the substrate 101. The buffer layer may be formed so as to have a single layer, or a plurality of layers made of different materials may be stacked to constitute the buffer layer. The buffer layer disposed on the substrate 101 may also be referred to as a passivation film. The buffer layer may be omitted.

The gate electrode 110 is disposed on the substrate 101. The gate electrode 110 may include at least one of an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chrome (Cr), tantalum (Ta), neodymium (Nd), or titanium (Ti). The gate electrode 110 may have a multi-layer film structure including at least two conductive films that have different physical properties.

The gate insulation film 150 is disposed on the gate electrode 110. The gate insulation film 150 serves as an insulation film between the oxide semiconductor layer 120 and the gate electrode 110.

The gate insulation film 150 may include at least one of a silicon oxide or a silicon nitride. The gate insulation film 150 may include an aluminum oxide ($Al_2O_3$).

The gate insulation film 150 may have a single-film structure or a multi-film structure. For example, any one of an aluminum oxide layer, a silicon oxide layer, and a silicon nitride layer may individually form the gate insulation film 150. Alternatively, the aluminum oxide layer, the silicon oxide layer, and the silicon nitride layer may be stacked to form the gate insulation film 150.

Referring to FIG. 1, the gate insulation film 150 includes two insulation films 151 and 152. The two insulation films 151 and 152 may be referred to as a first gate insulation film 151 and a second gate insulation film 152, respectively. However, the structure of the gate insulation film 150 according to the embodiment of the present disclosure is not limited thereto. For example, the gate insulation film 150 may be composed of a single film, or may be composed of three or more films.

According to an embodiment of the present disclosure, the oxide semiconductor layer 120 is disposed on the gate insulation film 150. The oxide semiconductor layer 120 is isolated from the gate electrode 110, and overlaps at least a portion of the gate electrode 110.

The oxide semiconductor layer 120 includes indium (In), gallium (Ga), zinc (Zn), tin (Sn), and oxygen (O). Indium (In), gallium (Ga), zinc (Zn), and tin (Sn) are 5s-orbital-based metals, each of which may be coupled to oxygen in order to exhibit semiconductor properties.

An oxide semiconductor layer 120 including indium (In), gallium (Ga), zinc (Zn), and tin (Sn) according to an embodiment of the present disclosure may also be referred to as an IGZTO semiconductor layer.

According to an embodiment of the present disclosure, the content of indium (In) in the oxide semiconductor layer 120 is greater than the content of gallium (Ga) in the oxide semiconductor layer 120, and the content of indium (In) in the oxide semiconductor layer 120 is substantially equal to the content of zinc (Zn) in the oxide semiconductor layer 120. Here, the content of each ingredient is set based on the number of atoms, and may be expressed as atomic percent (at %). The same is true of the following.

The content of indium (In) may be 1.5 to 5 times the content of gallium (Ga). When the amount of indium (In) is less than 1.5 times the content of gallium (Ga), electric property of the oxide semiconductor layer 120 may be deteriorated. When the amount of indium (In) is more than 5 times the content of gallium (Ga), layer stability of the oxide semiconductor layer 120 may be deteriorated. More specifically, the content of indium (In) may be 2 to 4 times the content of gallium (Ga).

The content of indium (In) and the content of zinc (Zn) are substantially the same based on the number of atoms. Here, "substantially the same content" means the same content within an error range. For example, the content of indium (In) and the content of zinc (Zn) may be substantially the same within an error range of ±10%. More specifically, the content of indium (In) may be 0.9 to 1.1 times the content of zinc (Zn).

The oxide semiconductor layer 120 according to the embodiment of the present disclosure includes a relatively small amount of tin (Sn). According to an embodiment of the present disclosure, the ratio (Sn/In) of the content of tin (Sn) to the content of indium (In) is 0.1 to 0.25. The content of indium (In) may be 4 to 10 times the content of tin (Sn) based on the number of atoms.

For example, the content of indium (In) may be 30 to 50% of the total content of indium (In), gallium (Ga), zinc (Zn), and tin (Sn) based on the number of atoms, the content of gallium (Ga) may be 10 to 20% of the total content thereof, the content of zinc (Zn) may be 20 to 50% of the total content thereof, and the content of tin (Sn) may be 3 to 12.5% of the total content thereof.

In the case in which the ratio (Sn/In) of the content of tin (Sn) to the content of indium (In) is less than 0.1, the mobility, the carrier concentration, the packing density, and the negative bias temperature illuminance stress (NBTIS) of the oxide semiconductor layer 120 may be decreased, and the spin density of the oxide semiconductor layer 120 may be increased, whereby the incidence of defects in the oxide semiconductor layer 120 may be increased, and a change $\Delta V_{th}$ in the threshold voltage of the oxide semiconductor layer 120 and the positive bias temperature stress (PBTS) of the oxide semiconductor layer 120 may be increased.

Here, NBTIS is a stress under light irradiation conditions, such as negative (−) bias voltage, predetermined temperature, and predetermined illuminance. NBTIS generally has a negative (−) value. In the case in which NBTIS is decreased, it means that the negative (−) absolute value of the NBTIS is increased. In the case in which NBTIS is decreased (or the absolute value of the NBTIS is increased), the stress of the oxide semiconductor layer 120 or the thin-film transistor 100 to temperature and light may be increased, whereby the reliability of the oxide semiconductor layer 120 or the thin-film transistor 100 may be reduced.

PBTS is a stress under conditions in which positive (+) bias voltage and predetermined temperature are applied. PBTS generally has a positive (+) value. In the case in which PBTS is increased, the stress of the oxide semiconductor layer 120 or the thin-film transistor 100 may be increased, and a change $\Delta V_{th}$ in the threshold voltage of the oxide semiconductor layer 120 or the thin-film transistor 100 may be increased.

Even in the case in which the ratio (Sn/In) of the content of tin (Sn) to the content of indium (In) is greater than 0.25, on the other hand, the mobility and the carrier concentration of the oxide semiconductor layer 120 are not increased any further but remain saturated, whereby the effect due to the increase in the content of tin (Sn) does not appear. Rather, in the case in which the ratio (Sn/In) of the content of tin (Sn) to the content of indium (In) is more than 0.25, the packing density of the oxide semiconductor layer 120 is decreased, and the spin density of the oxide semiconductor layer 120 is increased, whereby the incidence of defects in the oxide semiconductor layer 120 is increased. In addition, NBTIS is decreased (i.e., the absolute value of the NBTIS is increased) and PBTS is increased, whereby the stress of the oxide semiconductor layer 120 and the thin-film transistor 100 is increased, a change $\Delta V_{th}$ in the threshold voltage of the oxide semiconductor layer 120 and the thin-film transistor 100 is increased, and the s-factor thereof is increased.

The s-factor (sub-threshold swing) indicates the reciprocal of a slope within a period in which the thin-film transistor operates as a switching device in a graph showing the properties of drain current to gate voltage. In the case in which the s-factor is increased, the slope is decreased in the graph showing the properties of drain current to gate voltage, whereby the switching property of the thin-film transistor 100 is deteriorated.

In the oxide semiconductor layer 120 according to the embodiment of the present disclosure, the content of tin (Sn) is 10 to 25% the content of indium (In) (0.1≤Sn/In≤0.25), whereby the oxide semiconductor layer 120 may exhibit excellent mobility, threshold voltage ($V_{th}$) property, and reliability. In addition, the thin-film transistor 100 including the oxide semiconductor layer 120 according to the embodiment of the present disclosure exhibits excellent mobility and threshold voltage property. Furthermore, the thin-film transistor 100 has low PBTS and NBTIS (an absolute value), whereby the reliability of the thin-film transistor 100 is excellent.

According to an embodiment of the present disclosure, the oxide semiconductor layer 120 has a thickness of 20 nm or more. In the case in which the thickness of the oxide semiconductor layer 120 is less than 20 nm, the threshold voltage $V_{th}$ thereof is increased, the PBTS thereof is increased, the NBTIS thereof is decreased, then s-factor thereof is increased, and a distribution of the threshold voltage $V_{th}$ thereof is increased. The distribution of the threshold voltage $V_{th}$ indicates a degree of change in the threshold voltage $V_{th}$. In the case in which the distribution of the threshold voltage $V_{th}$ is high, the uniformity in the threshold voltage $V_{th}$ is low, whereby the threshold voltage $V_{th}$ of the thin-film transistor does not have a specific value but is changed. As a result, the switching property of the thin-film transistor 100 is reduced, whereby the reliability of the thin-film transistor 100 is reduced.

The thickness of the oxide semiconductor layer 120 may be adjusted to 50 nm or less. More specifically, the thickness of the oxide semiconductor layer 120 may be adjusted to 40 nm or less. Still more specifically, the thickness of the oxide semiconductor layer 120 may be adjusted to 30 nm or less. However, the present disclosure is not limited thereto. The thickness of the oxide semiconductor layer 120 may be changed as needed.

According to an embodiment of the present disclosure, the oxide semiconductor layer 120 has C-axis-oriented crystallinity. More specifically, the oxide semiconductor layer 120 according to the embodiment of the present disclosure may have a plurality of crystalline parts. A crystalline part is a region having crystallinity. The C axis faces a direction that is approximately perpendicular to the surface of the oxide semiconductor layer 120 (a normal line).

The crystallinity of the oxide semiconductor layer 120 may be formed by heat treatment performed during the deposition of the oxide semiconductor layer 120. The fluctuation in the properties of a thin-film transistor 100 including an oxide semiconductor layer 120 that exhibits crystallinity due to the irradiation of visible rays or ultraviolet rays is small. An oxide semiconductor layer 120 exhibiting crystallinity has lower defect density than a non-crystalline oxide semiconductor layer, and a reduction in the mobility of the oxide semiconductor layer 120 is constrained. The crystallinity of the oxide semiconductor layer 120 may be observed using a transmission electron microscope (TEM).

Figure 19:
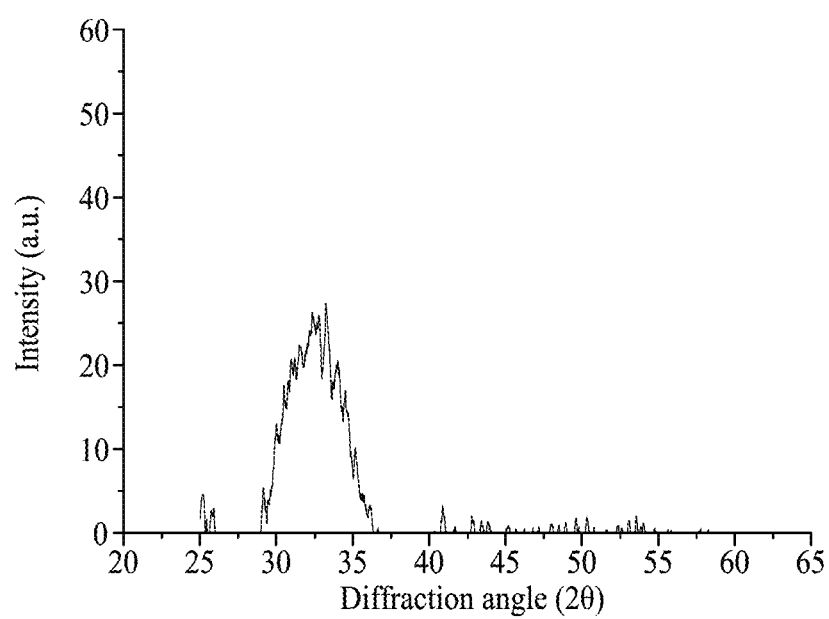
FIG. 19 is a view showing the results of analysis of X-ray diffraction (XRD) of an oxide semiconductor layer.

In the case in which X-ray diffraction (XRD) analysis is performed on the oxide semiconductor layer 120 according to the embodiment of the present disclosure, a peak appears in the vicinity of a diffraction angle (2θ) of 32 degrees (see FIG. 19). The peak at the diffraction angle (2θ) of 32 degrees corresponds to C-axis-oriented crystallinity.

According to an embodiment of the present disclosure, the oxide semiconductor layer 120 has a mobility of 18 cm²/V·s or more. In the case in which the oxide semiconductor layer 120 has a mobility of 18 cm²/V·s or more, the thin-film transistor 100 may exhibit excellent current properties. According to an embodiment of the present disclosure, the content of indium (In), gallium (Ga), zinc (Zn), and tin (Sn) may be adjusted and manufacturing process conditions may be controlled such that the oxide semiconductor layer 120 has a mobility of 18 cm²/V·s or more. More specifically, the oxide semiconductor layer 120 may have a mobility of 20 cm²/V·s or more.

Since the oxide semiconductor layer 120 according to the embodiment of the present disclosure has excellent mobility, the thin-film transistor 100 may exhibit excellent current properties. Consequently, the thin-film transistor 100 according to the embodiment of the present disclosure may be applied to a large-area display apparatus or a high-resolution display apparatus such that the display apparatus exhibits an excellent display property.

In addition, the oxide semiconductor layer 120 has a carrier concentration of $5 \times 10^{17}$ EA/cm³ or more. More specifically, the oxide semiconductor layer 120 has a carrier concentration ranging from $5 \times 10^{17}$ EA/cm³ to $1 \times 10^{19}$ EA/cm³. The content of indium (In), gallium (Ga), zinc (Zn), and tin (Sn), the deposition temperature, and the heat treatment temperature may be adjusted in order to control the carrier concentration.

The oxide semiconductor layer 120 according to the embodiment of the present disclosure has a packing density of 6.5 g/cm³ or more. Specifically, the oxide semiconductor layer 120 according to the embodiment of the present disclosure may have a packing density ranging from 6.5 to 7.0 g/cm³. More specifically, the oxide semiconductor layer 120 may have a packing density ranging from 6.5 to 6.8 g/cm³.

An IGZO-based oxide semiconductor, which is generally used as an oxide semiconductor, has a packing density of about 6.3 g/cm³. In contrast, the oxide semiconductor layer 120 according to the embodiment of the present disclosure may have a packing density of 6.5 g/cm³ or more. Consequently, the oxide semiconductor layer 120 according to the embodiment of the present disclosure may be crystalline, and the thin-film transistor 100 including the oxide semiconductor layer 120 may be able to withstand visible rays or ultraviolet rays. As a result, the fluctuation in properties of the thin-film transistor 100 due to irradiation with visible rays or ultraviolet rays is reduced, whereby the reliability of the thin-film transistor 100 is improved.

The oxide semiconductor layer 120 according to the embodiment of the present disclosure has a spin density of $2.0 \times 10^{17}$ spins/cm³ or less. The spin density is a criterion based on which the defect density of the oxide semiconductor layer 120 may be determined. Here, the defect density is a measure of the extent of defects of atoms in the oxide semiconductor layer 120. More specifically, the defect density may correspond to a degree of defect of oxygen (O) atoms. In the case in which the spin density of the oxide semiconductor layer 120 is $2.0 \times 10^{17}$ spins/cm³ or less, oxygen defect, such as oxygen vacancy (O-vacancy), is prevented, whereby the oxide semiconductor layer 120 is prevented from becoming a conductor.

More specifically, the oxide semiconductor layer 120 according to the embodiment of the present disclosure may have a spin density of $1.5 \times 10^{17}$ spins/cm³ or more. That is, the oxide semiconductor layer 120 may have a spin density ranging from $1.5 \times 10^{17}$ to $2.0 \times 10^{17}$ spins/cm³.

The oxide semiconductor layer 120 according to the embodiment of the present disclosure having the properties described above may form a short channel having a channel length of 4 μm or less. Here, the channel length may be defined as the distance between the source electrode 130 and the drain electrode 140. In the case in which the oxide semiconductor layer 120 according to the embodiment of the present disclosure is used, therefore, the area of the thin-film transistor 100 may be reduced. Consequently, the thin-film transistor 100 may be used to manufacture an ultra-high-density or ultra-high-resolution display apparatus.

The source electrode 130 is disposed so as to be connected to the oxide semiconductor layer 120. The drain electrode 140 is connected to the oxide semiconductor layer 120 in the state of being spaced apart from the source electrode 130. Referring to FIG. 1, the source electrode 130 and the drain electrode 140 are disposed on the gate insulation film 150, and overlap at least a portion of the oxide semiconductor layer 120.

Each of the source electrode 130 and the drain electrode 140 may include at least one of molybdenum (Mo), aluminum (Al), chrome (Cr), gold (Au), titanium (Ti), nickel (Ni), neodymium (Nd), copper (Cu), or an alloy thereof. Each of the source electrode 130 and the drain electrode 140 may be formed so as to have a single layer made of a metal or an alloy of metals, or may be formed so as to have a plurality of layers, such as two or more layers.

The structure in which the gate electrode 110 is disposed below the oxide semiconductor layer 120 as shown in FIG. 1 is called a bottom gate structure. Here, the oxide semiconductor layer 120, the gate electrode 110, the source electrode 130, and the drain electrode 140 form the thin-film transistor 100.

Figure 2A:
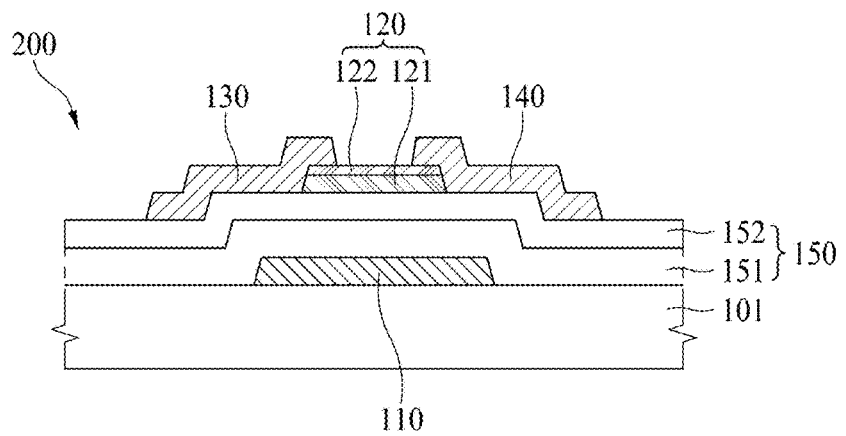
FIGS. 2A and 2B are cross-sectional views of thin-film transistors according to other embodiments of the present disclosure.

FIG. 2A is a cross-sectional view of a thin-film transistor 200 according to another embodiment of the present disclosure. Hereinafter, a description of the components that have already been described above will be omitted in order to avoid duplication of description.

An oxide semiconductor layer 120 according to another embodiment of the present disclosure has a structure in which a plurality of layers is stacked. Referring to FIG. 2A, the oxide semiconductor layer 120 has a first layer 121 and a second layer 122, which are sequentially stacked. The oxygen (O) content of the second layer 122 is greater than the oxygen (O) content of the first layer 121. For example, the oxygen content of the second layer 122 may be 1.2 to 2.5 times the oxygen content of the first layer 121. Even when oxygen is lost in the second layer 122, therefore, the oxygen content of the second layer 122 may remain sufficient to realize the semiconductor properties of the second layer 122. However, a content ratio of each of indium (In), gallium (Ga), zinc (Zn) and tin (Sn) based on total amount of indium (In), gallium (Ga), zinc (Zn) and tin (Sn) is substantially same in the first layer and the second layer.

Referring to FIG. 2A, at least a portion of the upper part of the second layer 122 may be exposed from the source electrode 130 and the drain electrode 140 so as to contact an insulation layer that is additionally formed. At this time, oxygen may be lost in the second layer 122. Since the oxygen (O) content of the second layer 122 is greater than the oxygen (O) content of the first layer 121, however, excellent semiconductor properties of the second layer 122 may be maintained even when oxygen is lost in the second layer 122.

According to another embodiment of the present disclosure, a channel region may be formed in the second layer 122 of the oxide semiconductor layer 120. The channel region may be formed in the first layer 121 of the oxide semiconductor layer 120.

The thickness of the second layer 122 is not particularly restricted. In consideration of the properties of the manufacturing process and the stability of the channel region, the thickness of the second layer 122 may be 5 to 20% the thickness of the oxide semiconductor layer 120. However, the present disclosure is not limited thereto. The thickness of the second layer 122 may be less than 5% the thickness of the oxide semiconductor layer 120, or may be more than 20% the thickness of the oxide semiconductor layer 120

Figure 2B:
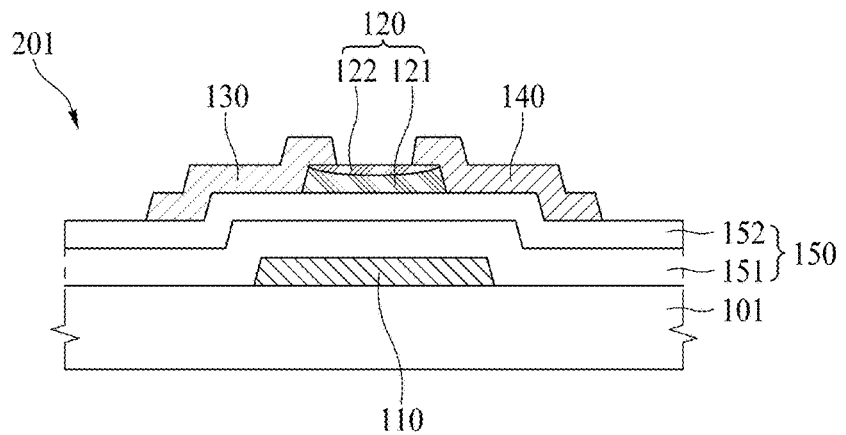

FIG. 2B is a cross-sectional view of a thin-film transistor 201 according to another embodiment of the present disclosure. Referring to FIG. 2B, the thickness of the region of the second layer 122 that does not overlap the source electrode 130 and the drain electrode 140 is greater than the thickness of the region of the second layer 122 that overlaps at least one of the source electrode 130 or the drain electrode 140. The second layer 122 may be formed by injecting oxygen through plasma treatment, etc. At this time, each of the source electrode 130 and the drain electrode 140 serves as a shielding layer. As a result, the thickness of the region of the second layer 122 that overlaps the source electrode 130 or the drain electrode 140 may be less than the thickness of the region of the second layer 122 that does not overlap the source electrode 130 or the drain electrode 140.

Figure 3:
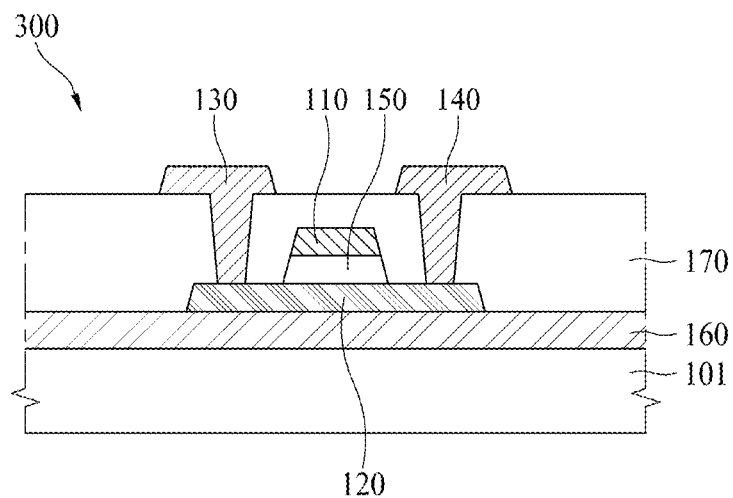
FIG. 3 is a cross-sectional view of a thin-film transistor according to another embodiment of the present disclosure.

FIG. 3 is a cross-sectional view of a thin-film transistor 300 according to another embodiment of the present disclosure.

The thin-film transistor 300 shown in FIG. 3 includes a buffer layer 160 disposed on a substrate 101, an oxide semiconductor layer 120 disposed on the buffer layer 160, a gate electrode 110 disposed so as to overlap at least a portion of the oxide semiconductor layer 120 in the state of being isolated from the oxide semiconductor layer 120, a gate insulation film 150 disposed between the gate electrode 110 and the oxide semiconductor layer 120, an interlayer insulation film 170 disposed on the gate electrode 110, a source electrode 130 connected to the oxide semiconductor layer 120, and a drain electrode 140 connected to the oxide semiconductor layer 120 in the state of being spaced apart from the source electrode 130.

The buffer layer 160 may include at least one of a silicon oxide or a silicon nitride. The buffer layer 160 exhibits a high insulation property, high moisture- and oxygen-blocking properties, and a planar property. The buffer layer 160 protects the oxide semiconductor layer 120.

The buffer layer 160 may be composed of a single film, or may have a structure in which two or more films are stacked. A light-blocking layer (not shown) may be disposed between the substrate 101 and the buffer layer 160 or on the buffer layer 160. The light-blocking layer protects the oxide semiconductor layer 120 from light.

The oxide semiconductor layer 120 includes indium (In), gallium (Ga), zinc (Zn), tin (Sn), and oxygen (O). The content of indium (In) is greater than the content of gallium (Ga), and the content of indium (In) is substantially equal to the content of zinc (Zn). The ratio (Sn/In) of the content of tin (Sn) to the content of indium (In) is 0.1 to 0.25.

The gate insulation film 150 is disposed on the oxide semiconductor layer 120, and the gate electrode 110 is disposed on the gate insulation film 150. The gate electrode 110 is isolated from the oxide semiconductor layer 120 by the gate insulation film 150. A gate insulation film 150 composed of a single layer is shown in FIG. 3.

The interlayer insulation film 170 is disposed on the gate electrode 110. The interlayer insulation film 170 is composed of an insulation material. Specifically, the interlayer insulation film 170 may be composed of an organic material, an inorganic material, or a stack including an organic material layer and an inorganic material layer.

The source electrode 130 and the drain electrode 140 are disposed on the interlayer insulation film 170. The source electrode 130 and the drain electrode 140 are connected to the oxide semiconductor layer 120 in the state of being spaced apart from each other. Referring to FIG. 3, the source electrode 130 and the drain electrode 140 are connected to the oxide semiconductor layer 120 via contact holes formed through the interlayer insulation film 170.

The structure in which the gate electrode 110 is disposed above the oxide semiconductor layer 120 as shown in FIG. 3 is called a top gate structure. The oxide semiconductor layer 120, the gate electrode 110, the source electrode 130, and the drain electrode 140 form the thin-film transistor 300.

Figure 4:
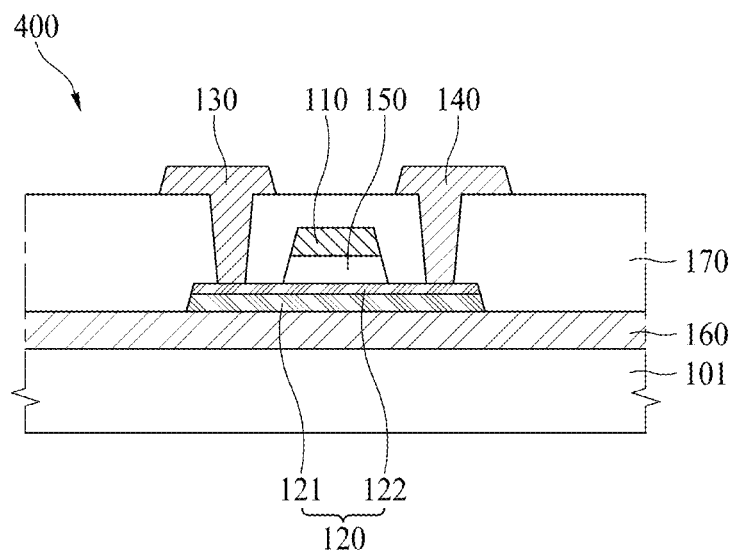
FIG. 4 is a cross-sectional view of a thin-film transistor according to another embodiment of the present disclosure.

FIG. 4 is a cross-sectional view of a thin-film transistor 400 according to another embodiment of the present disclosure. The thin-film transistor 400 shown in FIG. 4 has an oxide semiconductor layer 120 formed to have a structure in which a plurality of layers is stacked, unlike the thin-film transistor 300 shown in FIG. 3.

Referring to FIG. 4, the oxide semiconductor layer 120 has a first layer 121 and a second layer 122, which are sequentially stacked. Here, the oxygen (O) content of the second layer 122 is greater than the oxygen (O) content of the first layer 121. The upper part of the second layer 122 contacts the interlayer insulation film 170. Since the second layer 122 contains a relatively large amount of oxygen (O), excellent semiconductor properties of the second layer 122 may be maintained even when oxygen is lost in the second layer 122 due to contact with the interlayer insulation film 170.

Figure 5:
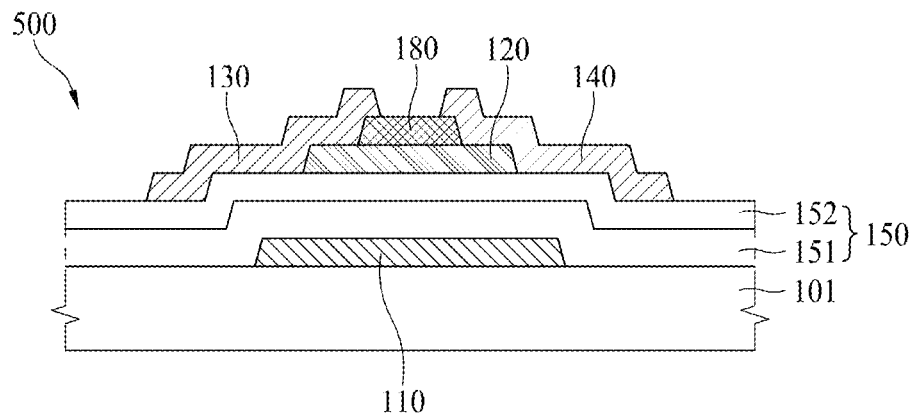
FIG. 5 is a cross-sectional view of a thin-film transistor according to another embodiment of the present disclosure.

FIG. 5 is a cross-sectional view of a thin-film transistor 500 according to another embodiment of the present disclosure.

Compared to the thin-film transistor 100 shown in FIG. 1, the thin-film transistor 500 shown in FIG. 5 further includes an etch stopper 180 disposed on the oxide semiconductor layer 120. The etch stopper 180 may be made of an insulation material, such as a silicon oxide. The etch stopper 180 may protect a channel region of the oxide semiconductor layer 120. Consequently, an oxide semiconductor layer 120 according to an embodiment of the present disclosure may be applied to a thin-film transistor 500 having an etch stopper structure.

Figure 6:
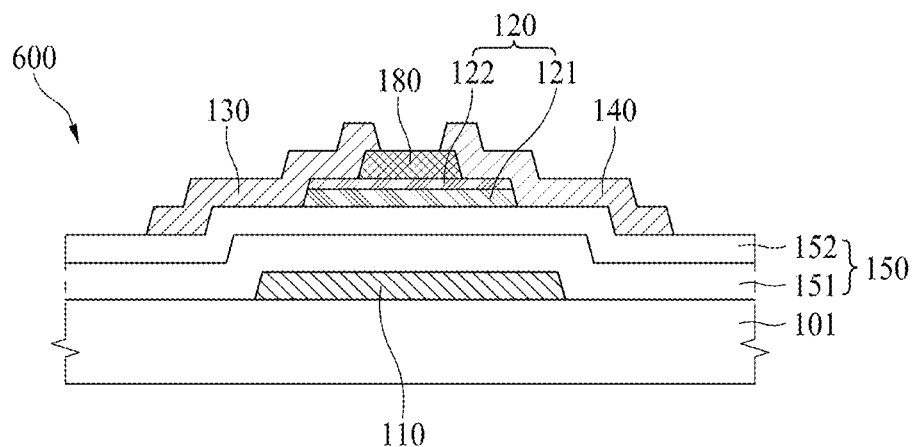
FIG. 6 is a cross-sectional view of a thin-film transistor according to another embodiment of the present disclosure.

FIG. 6 is a cross-sectional view of a thin-film transistor 600 according to another embodiment of the present disclosure.

Compared to the thin-film transistor 200 shown in FIG. 2A, the thin-film transistor 600 shown in FIG. 6 further includes an etch stopper 180 disposed on the oxide semiconductor layer 120. More specifically, the etch stopper 180 is disposed on the second layer 122 of the oxide semiconductor layer 120. The etch stopper 180 may be made of an insulation material, such as a silicon oxide. The etch stopper 180 may protect a channel region of the oxide semiconductor layer 120.

Hereinafter, a method of manufacturing a thin-film transistor 201 will be described with reference to FIGS. 7A to 7F.

FIGS. 7A to 7F are views showing a process of manufacturing a thin-film transistor 201 according to an embodiment of the present disclosure.

Figure 7A:
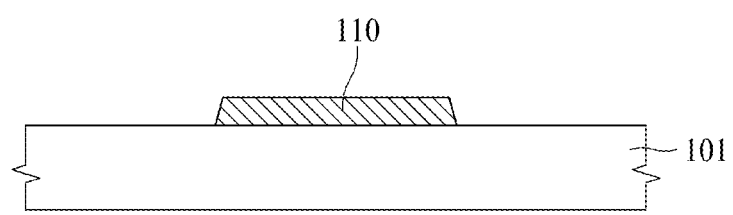
FIGS. 7A to 7F are views showing a process of manufacturing a thin-film transistor according to another embodiment of the present disclosure.

Referring to FIG. 7A, a gate electrode 110 is formed on a substrate 101.

Although not shown, a buffer layer (not shown) may be formed on the substrate 101 before the gate electrode 110 is formed on the substrate 101. The gate electrode 110 may be formed on the buffer layer.

Glass may be used as the substrate 101. Alternatively, transparent plastic that is bendable or flexible may be used as the substrate 101. An example of the plastic that is used as the substrate 101 is polyimide. In the case in which plastic is used as the substrate 101, manufacturing processes may be carried out in the state in which the substrate 101 is disposed on a carrier substrate composed of a highly durable material.

The gate electrode 110 may include at least one of an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chrome (Cr), tantalum (Ta), neodymium (Nd), or titanium (Ti).

Figure 7B:
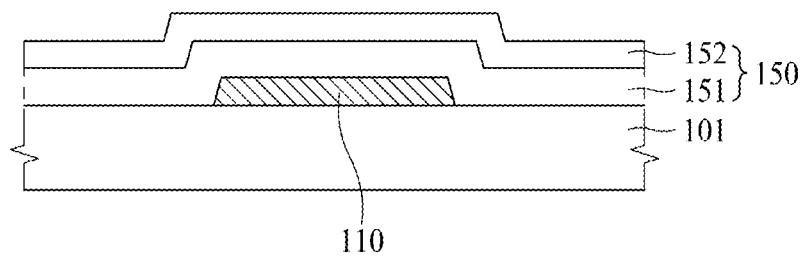

Referring to FIG. 7B, a gate insulation film 150 is formed on the gate electrode 110.

The gate insulation film 150 shown in FIG. 7B includes two insulation films 151 and 152. The two insulation films 151 and 152 may be referred to as a first gate insulation film 151 and a second gate insulation film 152, respectively. However, the structure of the gate insulation film 150 is not limited thereto. For example, the gate insulation film 150 may be composed of a single film, or may be composed of three or more films.

The gate insulation film 150 may include at least one of a silicon oxide, a silicon nitride, or an aluminum oxide ($Al_2O_3$). For example, the first gate insulation film 151 may be formed by at least one of a silicon oxide, a silicon nitride, or an aluminum oxide ($Al_2O_3$), and the second gate insulation film 152 may be formed on the first gate insulation film 151 by at least one of a silicon oxide, a silicon nitride, or an aluminum oxide ($Al_2O_3$).

Figure 7C:
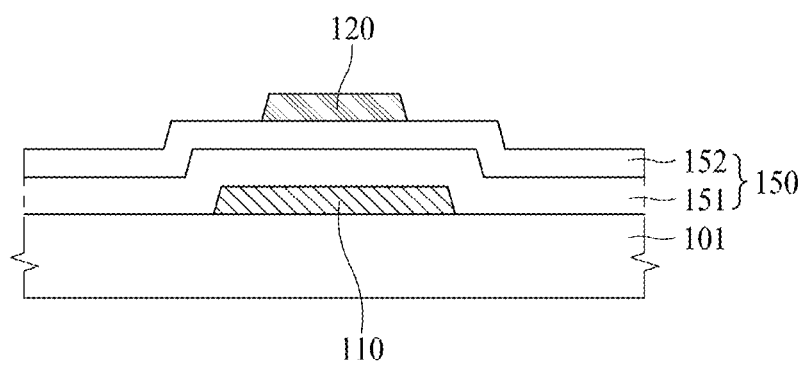

Referring to FIG. 7C, an oxide semiconductor layer 120 is formed on the gate insulation film 150. The oxide semiconductor layer 120 includes indium (In), gallium (Ga), zinc (Zn), tin (Sn), and oxygen (O).

The oxide semiconductor layer 120 may be formed by deposition. A deposition source including indium (In), gallium (Ga), zinc (Zn), tin (Sn), and oxygen (O) may be used for deposition. For example, an indium oxide, a gallium oxide, a zinc oxide, and a tin oxide may be used for deposition. Alternatively, an indium-zinc oxide, an indium-tin oxide, an indium-gallium oxide, and a gallium-zinc oxide may be used for deposition.

The composition of deposition source may be adjusted in order to form an oxide semiconductor layer 120 configured such that the content of indium (In) is greater than the content of gallium (Ga), the content of indium (In) and the content of zinc (Zn) are substantially the same, and the ratio (Sn/In) of the content of tin (Sn) to the content of indium (In) is 0.1 to 0.25.

Deposition may be performed at a temperature of 150° C. or higher. More specifically, deposition may be performed at a temperature ranging from 150 to 250° C. According to an embodiment of the present disclosure, the oxide semiconductor layer 120 may have a packing density of 6.5 g/cm$^3$ or more, C-axis-oriented crystallinity, and a spin density of $2.0 \times 10^{17}$ spins/cm$^3$ or less, whereby the oxide semiconductor layer 120 may have low defect density, since the oxide semiconductor layer 120 is formed by high-temperature deposition that is performed at a temperature of 150° C. or higher.

In the case in which deposition is performed at a temperature of lower than 150° C., the oxide semiconductor layer 120 may have a packing density of less than 6.5 g/cm$^3$, no C-axis-oriented crystallinity, or a spin density of more than $2.0 \times 10^{17}$ spins/cm$^3$, whereby the oxide semiconductor layer 120 may have high defect density. As a result, the PBTS and NBTIS properties of the oxide semiconductor layer 120 may be reduced.

The oxide semiconductor layer 120 is formed so as to have a thickness of 20 nm or more. In the case in which the thickness of the oxide semiconductor layer 120 is less than 20 nm, the threshold voltage $V_{th}$, the PBTS, the s-factor, and a distribution of the threshold voltage $V_{th}$ thereof may be increased. The oxide semiconductor layer 120 may be formed so as to have a thickness ranging from 20 to 50 nm. More specifically, the oxide semiconductor layer 120 may be formed so as to have a thickness ranging from 20 to 40 nm. Alternatively, the oxide semiconductor layer 120 may be formed so as to have a thickness ranging from 20 to 30 nm.

Figure 7D:
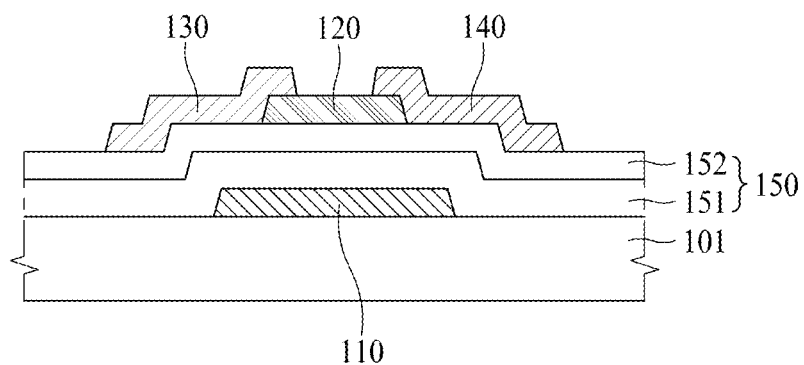

Referring to FIG. 7D, a source electrode 130 and a drain electrode 140 are formed on the oxide semiconductor layer 120. The source electrode 130 and the drain electrode 140 are connected to the oxide semiconductor layer 120 in the state of being spaced apart from each other.

Figure 7E:
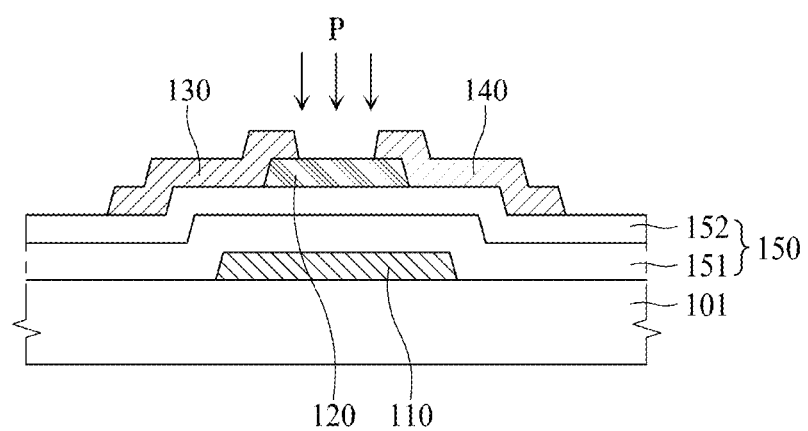

Referring to FIG. 7E, the oxide semiconductor layer 120 is plasma-treated. Plasma treatment may be performed using $N_2O$. At the plasma treatment step, energy of an amount ranging from 2.0 to 2.5 $kW/m^2$ may be applied. More specifically, energy of an amount ranging from 2.0 to 2.5 $kW/m^2$ is applied to $N_2O$ in order to plasma-treat the oxide semiconductor layer 120. A thin-film transistor 201 having the oxide semiconductor layer 120 plasma-treated as described above may exhibit excellent driving properties even under adverse conditions, such as vacancy of oxygen.

In the case in which the magnitude of plasma treatment energy is less than 2.0 $kW/m^2$, the driving properties of the thin-film transistor may be reduced under adverse conditions. On the other hand, in the case in which plasma treatment is performed using energy of an amount more than 2.5 $kW/m^2$, PBTS is increased, whereby the reliability of the thin-film transistor may be reduced.

Figure 7F:
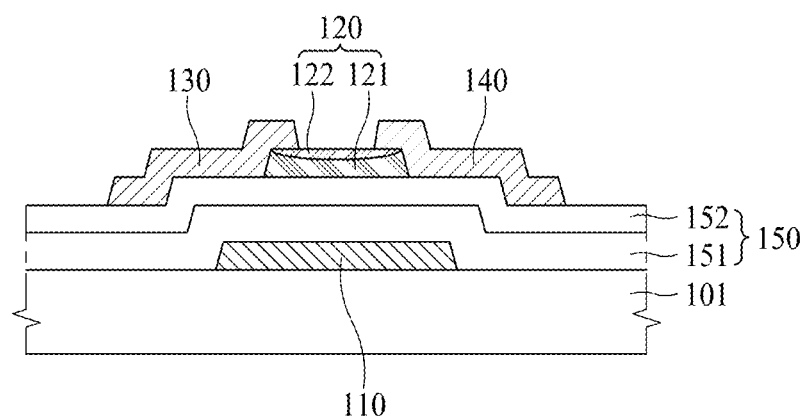

Referring to FIG. 7F, a second layer 122 is formed in the oxide semiconductor layer 120 by plasma treatment. Specifically, oxygen is injected into the upper part of the oxide semiconductor layer 120 by plasma treatment, whereby a portion of the oxide semiconductor layer 120 becomes the second layer 122. At this time, a region of the oxide semiconductor layer 120 that is not affected by plasma treatment or is little affected by plasma treatment becomes a first layer 121. The first layer 121 has a composition identical or similar to the composition of the oxide semiconductor layer 120 before plasma treatment.

The second layer 122 contains a larger amount of oxygen (O) than the first layer 121. For example, the oxygen content of the second layer 122 may be 1.2 to 2.5 times the oxygen content of the first layer 121.

The second layer 122 formed by plasma treatment may have a thickness equivalent to 5 to 20% the total thickness of the oxide semiconductor layer 120.

Referring to FIG. 7F, the thickness of the region of the second layer 122 that does not overlap the source electrode 130 and the drain electrode 140 is greater than the thickness of the region of the second layer 122 that overlaps at least one of the source electrode 130 or the drain electrode 140. When the second layer 122 is formed by injecting oxygen through plasma treatment, each of the source electrode 130 and the drain electrode 140 serves as a shielding layer for blocking the injection of oxygen. As a result, the thickness of the region of the second layer 122 that overlaps the source electrode 130 or the drain electrode 140 is less than the thickness of the region of the second layer 122 that does not overlap the source electrode 130 or the drain electrode 140.

The plasma treatment process may be omitted. In the case in which the plasma treatment process is omitted, the thin-film transistor 100 shown in FIG. 1 may be manufactured.

Subsequently, the oxide semiconductor layer 120 may be heat-treated. In the case in which the oxide semiconductor layer 120 is not plasma-treated, a heat-treatment process may be performed after the oxide semiconductor layer 120 is formed.

Heat treatment is performed at a temperature of 300° C. or higher. Specifically, heat treatment may be performed at a temperature ranging from 300 to 400° C. More specifically, heat treatment may be performed at a temperature ranging from 350 to 400° C.

In the case in which heat treatment is performed at a temperature of 300° C. or higher, the oxide semiconductor layer 120 may have a packing density of 6.5 $g/cm^3$ or more, C-axis-oriented crystallinity, and a spin density of $2.0 \times 10^{17}$ $spins/cm^3$ or less, whereby the oxide semiconductor layer 120 may have low defect density.

In the case in which the heat treatment temperature is lower than 300° C., the oxide semiconductor layer 120 may have a packing density of less than 6.5 $g/cm^3$, no C-axis-oriented crystallinity, or a spin density of more than $2.0 \times 10^{17}$ $spins/cm^3$, whereby the oxide semiconductor layer 120 may have high defect density. As a result, the PBTS and NBTIS properties of the oxide semiconductor layer 120 may be reduced.

In the case in which the heat treatment temperature is higher than 400° C., the oxide semiconductor layer 120 or the thin-film transistor 201 may be damaged by the heat, and excessive cost may be incurred for heat treatment.

As the result of the heat treatment described above, the thin-film transistor 201 shown in FIG. 2B may be manufactured. Although not shown, an etch stopper 180 may be formed on the oxide semiconductor layer 120 (see FIGS. 5 and 6).

FIGS. 7A to 7F show a process of manufacturing a thin-film transistor 201 having a bottom gate structure in which a gate electrode 110, a gate insulation film 150, and an oxide semiconductor layer 120 are sequentially formed on a substrate 101. However, the present disclosure is not limited thereto.

The oxide semiconductor layer 120, the gate insulation film 150, and the gate electrode 110 may be sequentially formed on the substrate 101. In this case, a thin-film transistor 300 or 400 having the top gate structure shown in FIG. 3 or 4 may be manufactured.

Figure 8:
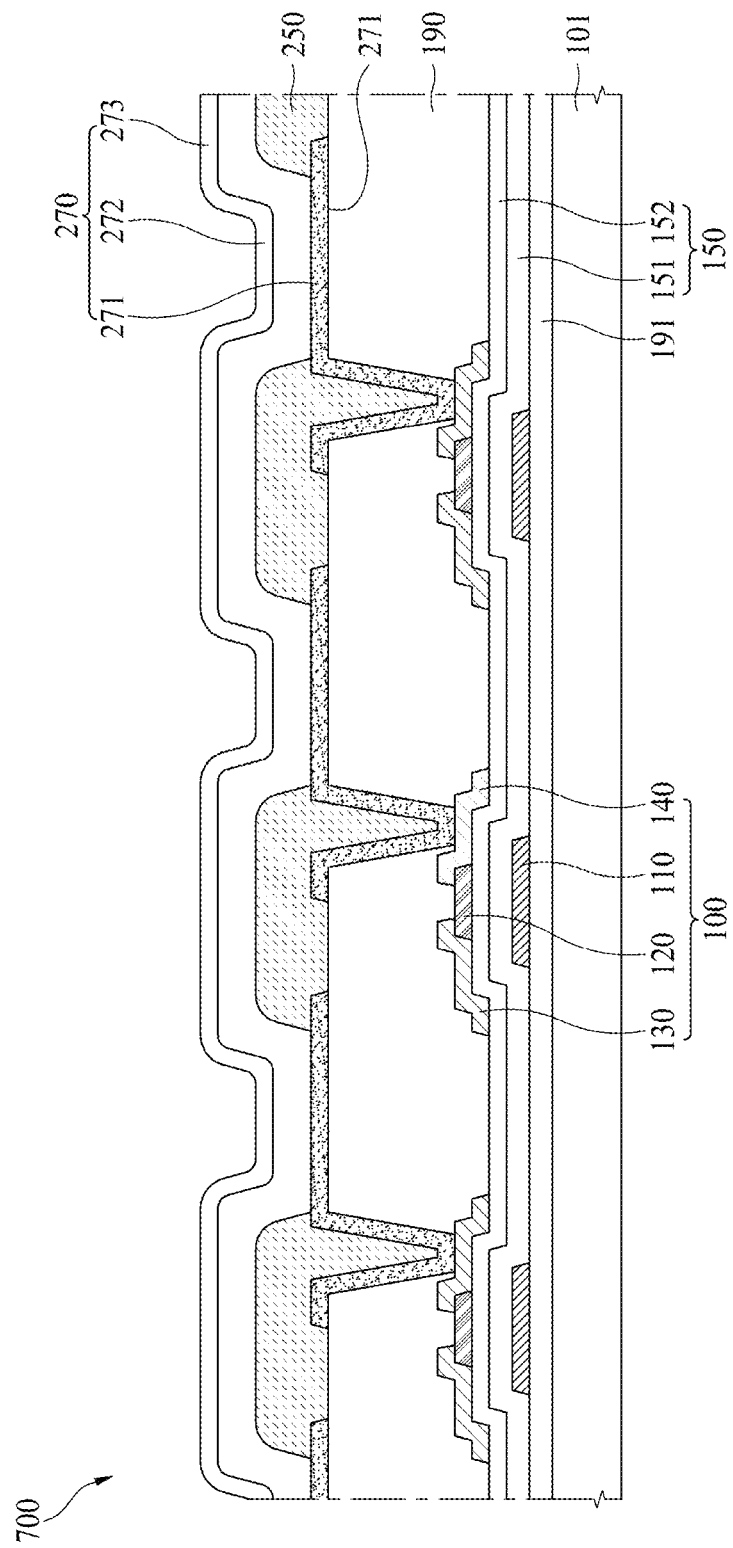
FIG. 8 is a schematic cross-sectional view of a display apparatus according to another embodiment of the present disclosure.

FIG. 8 is a schematic cross-sectional view of a display apparatus 700 according to another embodiment of the present disclosure.

The display apparatus 700 according to the embodiment of the present disclosure includes a substrate 101, a thin-film transistor 100, and an organic light-emitting device 270 connected to the thin-film transistor 100.

Although the display apparatus 700 including the thin-film transistor 100 of FIG. 1 is shown in FIG. 8, the thin-film transistors 200, 201, 300, 400, 500, and 600 shown in FIGS. 2A, 2B, 3, 4, 5, and 6 may be applied to the display apparatus 700 of FIG. 8, in addition to the thin-film transistor 100 of FIG. 1.

Referring to FIG. 8, the display apparatus 700 according to the embodiment of the present disclosure includes a substrate 101, a thin-film transistor 100 disposed on the substrate 101, and a first electrode 271 connected to the thin-film transistor 100. In addition, the display apparatus 700 includes an organic layer 272 disposed on the first electrode 271 and a second electrode 273 disposed on the organic layer 272.

Specifically, the substrate 101 may be made of glass or plastic. A buffer layer 191 is disposed on the substrate 101. The buffer layer 191 may be omitted.

The thin-film transistor 100 is disposed on the buffer layer 191, which is disposed on the substrate 101. The thin-film transistor 100 includes a gate electrode 110 disposed on the substrate 101, an oxide semiconductor layer 120 disposed so as to overlap at least a portion of the gate electrode 110 in the state of being isolated from the gate electrode 110, a gate insulation film 150 disposed between the gate electrode 110 and the oxide semiconductor layer 120, a source electrode 130 connected to the oxide semiconductor layer 120, and a drain electrode 140 connected to the oxide semiconductor layer 120 in the state of being spaced apart from the source electrode 130.

A planarization film 190 is disposed on the thin-film transistor 100 in order to planarize the upper part of the substrate 101. The planarization film 190 may be composed of an organic insulation material that exhibits photosensitivity, such as an acrylic resin. However, the present disclosure is not limited thereto.

The first electrode 271 is disposed on the planarization film 190. The first electrode 271 is connected to the drain electrode 140 of the thin-film transistor 100 via a contact hole formed through the planarization film 190.

A bank layer 250 is disposed on the first electrode 271 and the planarization film 190 in order to define a pixel region or a light-emitting region. For example, the bank layer 250 may be disposed at the interface between pixels in a matrix fashion such that the pixel region can be defined by the bank layer 250.

The organic layer 272 is disposed on the first electrode 271. The organic layer 272 may be disposed on the bank layer 250. That is, the organic layer 272 may not be divided for each pixel, but may be continuous between adjacent pixels.

The organic layer 272 includes an organic light-emitting layer. The organic layer 272 may include a single organic light-emitting layer or two or more organic light-emitting layers that are stacked in the vertical direction. The organic layer 272 may emit any one of red, green, and blue light. Alternatively, the organic layer 272 may emit white light.

The second electrode 273 is disposed on the organic layer 272.

The first electrode 271, the organic layer 272, and the second electrode 273 may be stacked to form the organic light-emitting device 270. The organic light-emitting device 270 may serve as a light quantity adjustment layer in the display device 700.

Although not shown, in the case in which the organic layer 272 emits white light, each pixel may include a color filter for filtering the white light emitted from the organic layer 272 for each wavelength. The color filter is disposed in a light movement path. In a so-called bottom-emission-type structure, in which light emitted from the organic layer 272 moves toward the substrate 101, which is disposed below the organic layer 272, the color filter is disposed below the organic layer 272. In a so-called top-emission-type structure, in which light emitted from the organic layer 272 moves toward the second electrode 273, which is disposed above the organic layer 272, the color filter is disposed above the organic layer 272.

Figure 9:
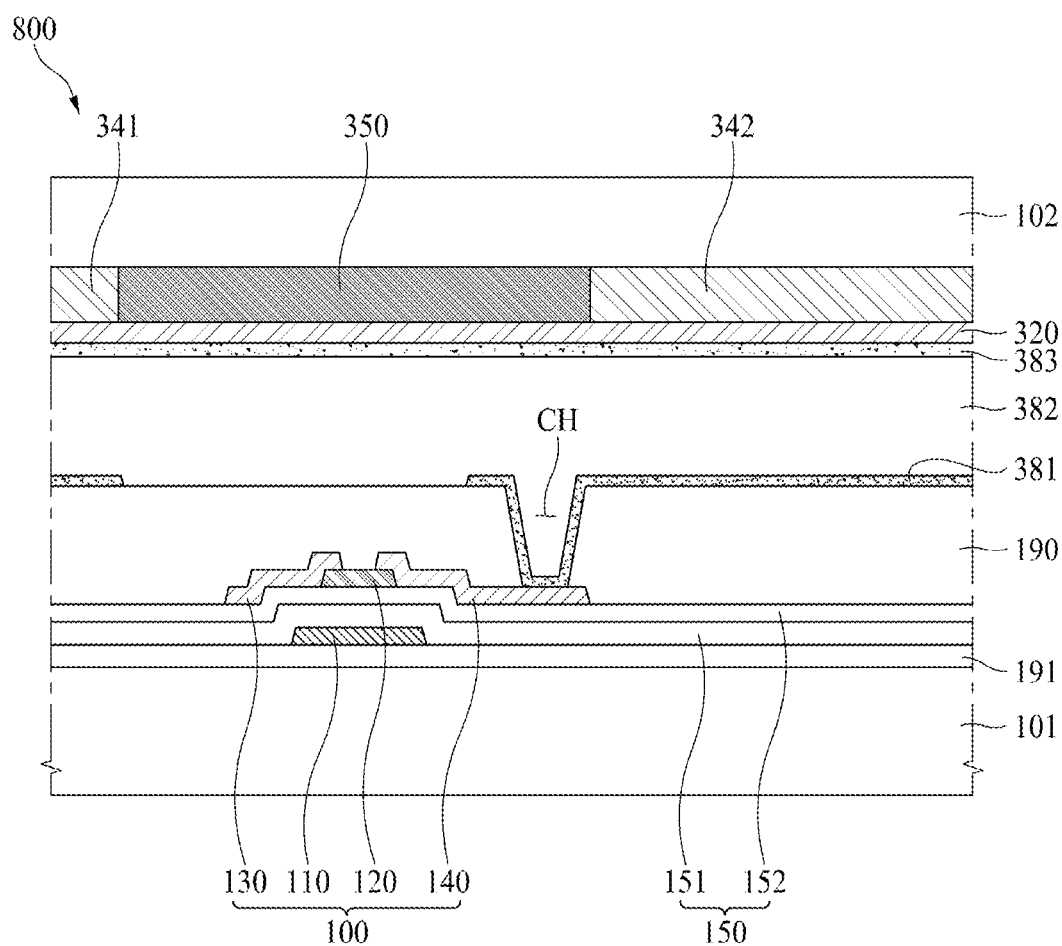
FIG. 9 is a schematic cross-sectional view of a display apparatus according to a further embodiment of the present disclosure.

FIG. 9 is a schematic cross-sectional view of a display apparatus 800 according to a further embodiment of the present disclosure.

Referring to FIG. 9, the display apparatus 800 according to the embodiment of the present disclosure includes a substrate 101, a thin-film transistor 100 disposed on the substrate 101, and a first electrode 381 connected to the thin-film transistor 100. In addition, the display apparatus 800 includes a liquid crystal layer 382 disposed on the first electrode 381 and a second electrode 383 disposed on the liquid crystal layer 382.

The liquid crystal layer 382 serves as a light quantity adjustment layer. As described above, the display apparatus 800 shown in FIG. 9 is a liquid crystal display apparatus including a liquid crystal layer 382.

Specifically, the display apparatus 800 of FIG. 9 includes a substrate 101, a thin-film transistor 100, a planarization film 190, a first electrode 381, a liquid crystal layer 382, a second electrode 383, a barrier layer 320, color filters 341 and 342, a light-blocking unit 350, and an opposite substrate 102.

The substrate 101 may be made of glass or plastic.

The thin-film transistor 100 is disposed on the substrate 101.

Referring to FIG. 9, a buffer layer 191 is disposed on the substrate 101, a gate electrode 110 is disposed on the buffer layer 191, a gate insulation film 150, which includes a first gate insulation film 151 and a second gate insulation film 152, is disposed on the gate electrode 110, an oxide semiconductor layer 120 is disposed on the gate insulation film 150, a source electrode 130 and a drain electrode 140 are disposed on the oxide semiconductor layer 120, and the planarization film 190 is disposed on the source electrode 130 and the drain electrode 140.

FIG. 9 shows a thin-film transistor 100 having a bottom gate structure, in which the gate electrode 110 is disposed below the oxide semiconductor layer 120. However, the present disclosure is not limited thereto. Alternatively, a thin-film transistor having a top gate structure, in which the gate electrode 110 is disposed above the oxide semiconductor layer 120, may be used. More specifically, the thin-film transistors 200, 201, 300, 400, 500, and 600 shown in FIGS. 2A, 2B, 3, 4, 5, and 6 may be applied to the display apparatus 800 of FIG. 9, in addition to the thin-film transistor 100 of FIG. 1.

The planarization film 190 is disposed on the thin-film transistor 100 in order to planarize the upper part of the substrate 101. The planarization film 190 may be composed of an organic insulation material that exhibits photosensitivity, such as an acrylic resin. However, the present disclosure is not limited thereto.

The first electrode 381 is disposed on the planarization film 190. The first electrode 381 is connected to the drain electrode 140 of the thin-film transistor 100 via a contact hole CH formed through the planarization film 190.

The opposite substrate 102 is disposed so as to be opposite the substrate 101.

The light-blocking unit 350 is disposed on the opposite substrate 102. The light-blocking unit 350 has a plurality of openings therein. The openings are disposed so as to correspond to first electrodes 381, which are pixel electrodes. The light-blocking unit 350 blocks the transmission of light through the remaining portion thereof excluding the openings. The light-blocking unit 350 is not essential, and thus may be omitted.

The color filters 341 and 342 are disposed on the opposite substrate 102, and selectively block the wavelength of light incident from a backlight unit (not shown). Specifically, the color filters 341 and 342 may be disposed in the openings defined by the light-blocking unit 350.

Each of the color filters 341 and 342 may express any one of red, green, and blue. Each of the color filters 341 and 342 may express a color other than red, green, or blue.

The barrier layer 320 may be disposed on the color filters 341 and 342 and the light-blocking unit 350. The barrier layer 320 may be omitted.

The second electrode 383 is disposed on the barrier layer 320. For example, the second electrode 383 may be disposed in front of the opposite substrate 102. The second electrode 383 may be composed of a transparent conductive material, such as ITO or IZO.

The first electrode 381 and the second electrode 383 are disposed so as to be opposite each other, and the liquid crystal layer 382 is disposed between the first electrode 381 and the second electrode 383. The second electrode 383 applies an electric field to the liquid crystal layer 382 together with the first electrode 381.

On the assumption that the surfaces of the substrate 101 and the opposite substrate 102 that face each other between the substrate 101 and the opposite substrate 102 are defined as upper surfaces of the substrate 101 and the opposite substrate 102 and the surfaces of the substrate 101 and the opposite substrate 102 that are opposite the upper surfaces thereof are defined as lower surfaces of the substrate 101 and the opposite substrate 102, a polarizing plate may be disposed on each of the lower surfaces of the substrate 101 and the opposite substrate 102.

Hereinafter, the present disclosure will be described in more detail with reference to Examples, Comparative Examples, and Experimental Examples.

Comparative Examples 1 to 3

Thin-film transistors according to Comparative Examples 1 to 3 having the structure shown in FIG. 1 were manufactured.

Specifically, a gate electrode 110 was formed on a substrate 101 made of glass, a first gate insulation film 151 and a second gate insulation film 152 were formed on the gate electrode 110, and an oxide semiconductor layer 120 having a thickness of 30 nm was formed according to the composition ratio shown in Table 1. Subsequently, a source electrode 130 and a drain electrode 140 were formed.

The threshold voltage $V_{th}$, the mobility, and the NBTIS of the thin-film transistors according to Comparative Examples 1 to 3, manufactured as described above, were measured.

Figure 10:
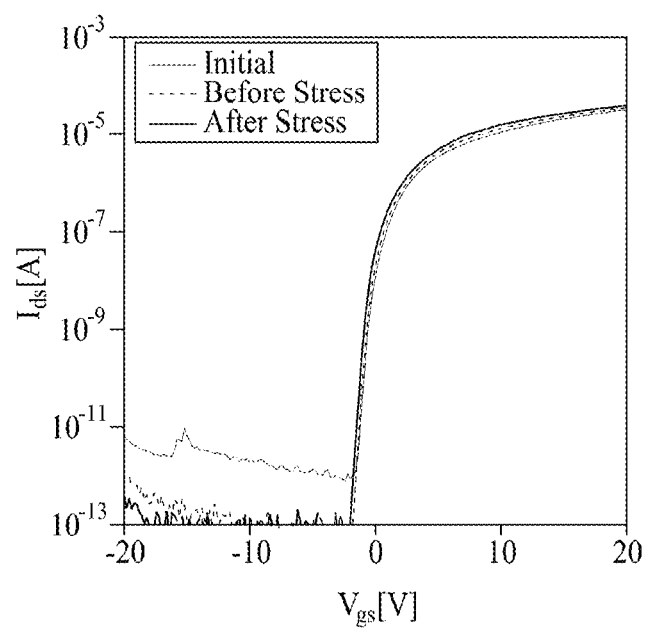
FIGS. 10, 11, and 12 are views respectively showing the results of measurement of the threshold voltage of thin-film transistors according to Comparative Examples 1, 2, and 3.
Figure 11:
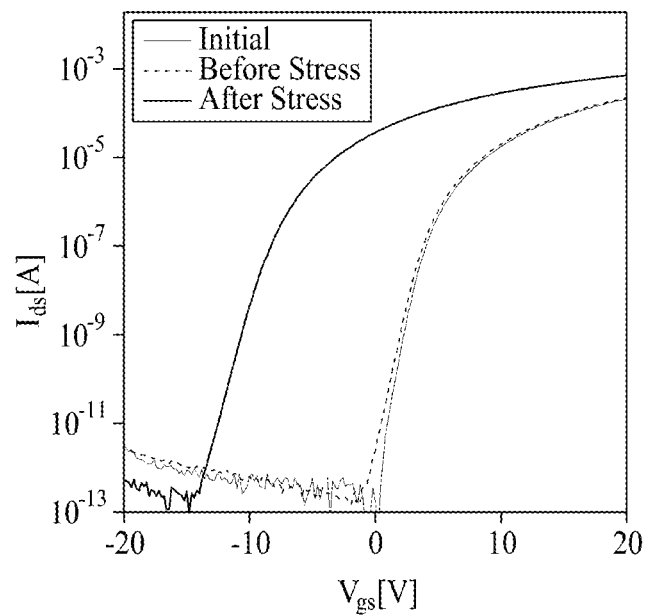
Figure 12:
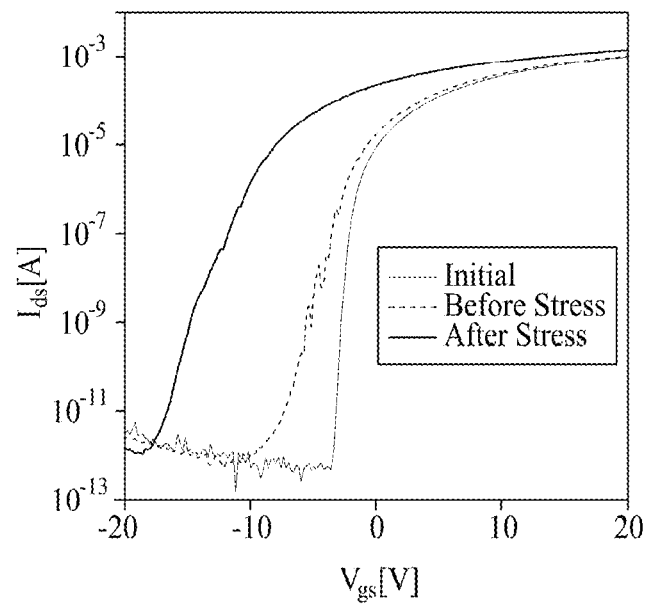

In order to measure the threshold voltage $V_{th}$ of the thin-film transistors according to Comparative Examples 1 to 3, drain current $I_{ds}$ was measured while a gate voltage $V_{gs}$ ranging from −20 V to +20 V was applied thereto. A voltage of 10 V was applied across the source electrode 130 and the drain electrode 140. FIGS. 10, 11, and 12 show the results of measurement of the threshold voltage $V_{th}$ of the thin-film transistors according to Comparative Examples 1, 2, and 3.

In addition, the mobility of the thin-film transistors according to Comparative Examples 1, 2, and 3 was measured according to Hall measurement. Herein, the mobility is a Hall mobility. Furthermore, negative (−) bias voltage was applied to the thin-film transistors according to Comparative Examples 1, 2, and 3 while visible light (white light) having a brightness of 4500 nit was irradiated to the thin-film transistors according to Comparative Examples 1, 2, and 3 at a temperature of 60° C. in order to measure the NBTIS of the thin-film transistors according to Comparative Examples 1, 2, and 3. The results are shown in Table 1 below.

TABLE 1

|  | Comparative Example 1 | Comparative Example 2 | Comparative Example 3 |
| --- | --- | --- | --- |
| Composition ratio of oxide semiconductor | In:Ga:Zn (1:1:1) | In:Ga (9:1) | In:Sn:Zn (2.6:1:3) |
| Mobility (cm²/V · s) | 10 | 16 | 19 |
| NBTIS (V) | −4 | −12 | −9 |

In FIGS. 10, 11, and 12, the term "initial" indicates an initial change in current, the term "before stress" indicates a change in current before the application of temperature and light to the thin-film transistors, and the term "after stress" indicates a change in current after a temperature of 60° C. and visible light (white light) having a brightness of 4500 nit are applied to the thin-film transistors.

Referring to FIGS. 10, 11, and 12 and Table 1, it can be seen that the thin-film transistor according to Comparative Example 1 exhibits a good NBTIS property but low mobility and that the thin-film transistors according to Comparative Examples 2 and 3 exhibit poor NBTIS properties, whereby the reliability of the thin-film transistors according to Comparative Examples 2 and 3 is low.

Comparative Example 4 and Examples 1 and 2

Thin-film transistors having the structure shown in FIG. 1 were manufactured in order to confirm the properties of the thin-film transistors based on the thickness of an oxide semiconductor layer 120 (Comparative Example 4 and Examples 1 and 2). The thin-film transistors were manufactured using the same method as that used to manufacture the thin-film transistor according to Comparative Example 1 except that the composition of the oxide semiconductor layer 120 was changed. Hereinafter, each of the thin-film transistors has the structure shown in FIG. 1, and may be manufactured using the same method as that used to manufacture the thin-film transistor according to Comparative Example 1, unless mentioned otherwise.

Specifically, thin-film transistors according to Comparative Example 4 and Examples 1 and 2, each having an oxide semiconductor layer 120 composed of indium (In), gallium (Ga), zinc (Zn), and tin (Sn) mixed at a ratio of 4:1:4:1 (based on the number of atoms), were manufactured. At this time, in Comparative Example 4 and Examples 1 and 2, the thickness of the oxide semiconductor layer 120 was 10 nm, 20 nm, and 30 nm, respectively.

Figure 13:
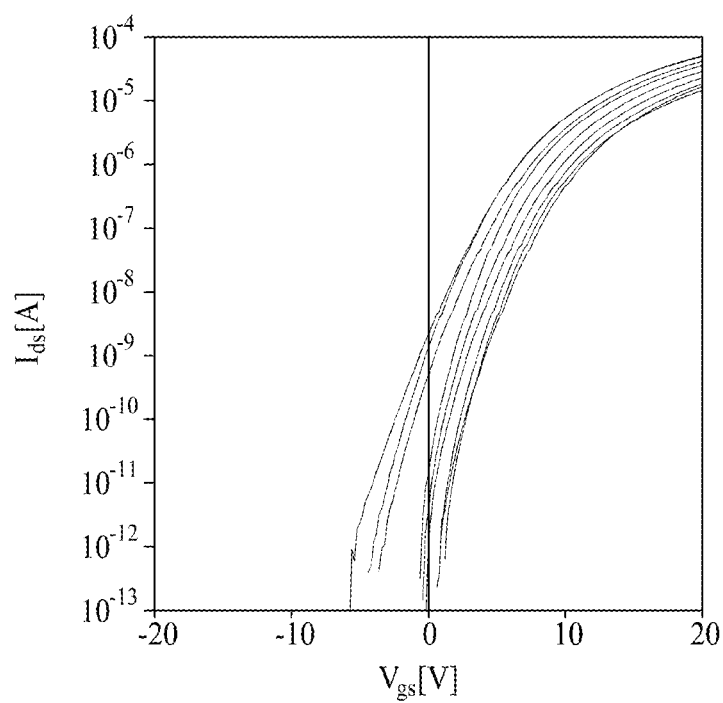
FIGS. 13, 14, and 15 are views respectively showing the results of measurement of the threshold voltage of thin-film transistors according to Comparative Example 4 and Examples 1 and 2.
Figure 14:
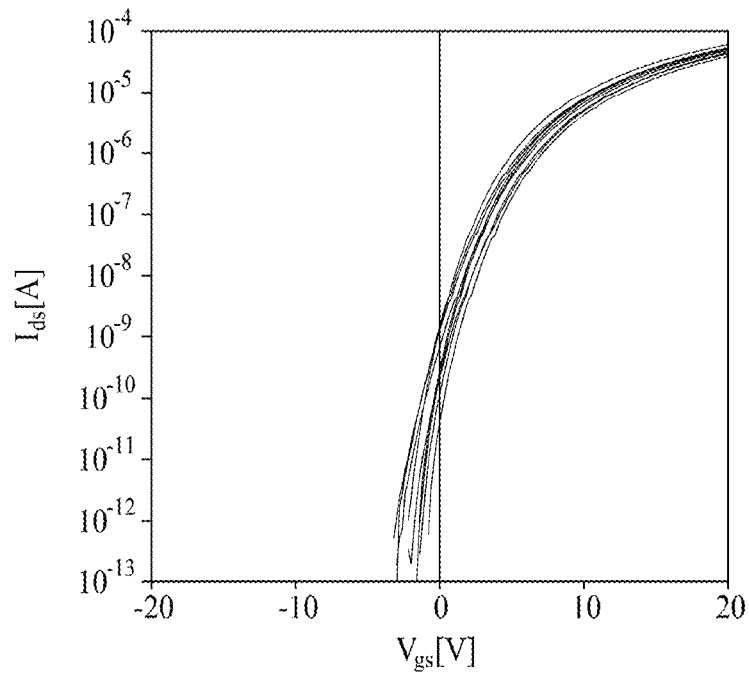
Figure 15:
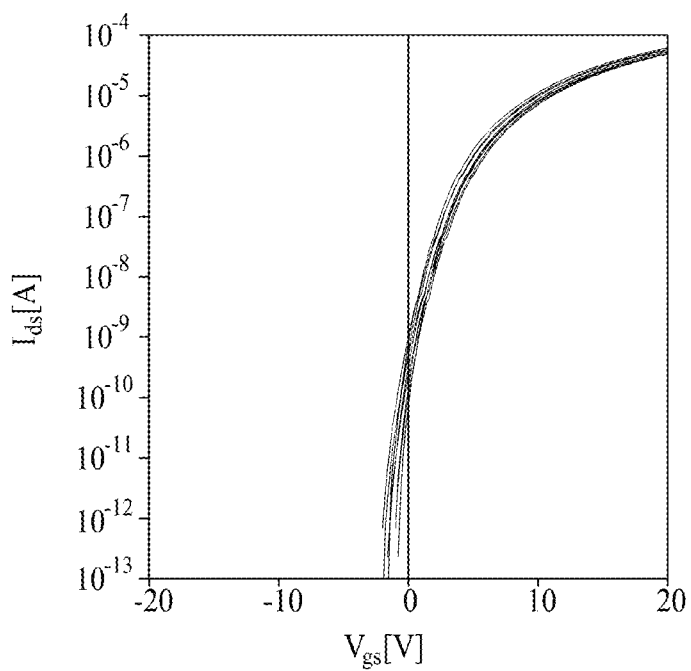

In order to measure the threshold voltage $V_{th}$ of the thin-film transistors according to Comparative Example 4 and Examples 1 and 2, the drain current $I_{ds}$ of the thin-film transistors was measured while a gate voltage $V_{gs}$ ranging from −20 V to +20 V was applied. A voltage of 10 V was applied across the source electrode 130 and the drain electrode 140. The threshold voltage $V_{th}$ of the thin-film transistors was measured nine times. FIGS. 13, 14, and 15 show the results of measurement of the threshold voltage $V_{th}$ of the thin-film transistors according to Comparative Example 4 and Examples 1 and 2.

In order to measure a distribution of the threshold voltage $V_{th}$, the gate voltage $V_{gs}$ of the thin-film transistors was measured. At this time, a difference between the maximum value and the minimum value of the measured gate voltage $V_{gs}$ was defined as a "distribution of the threshold voltage $V_{th}$." In addition, the PBTS of the thin-film transistors according to Comparative Example 4 and Examples 1 and 2 was measured while positive (+) bias voltage was applied to the thin-film transistors under a temperature stress of 60° C. The results are shown in Table 2.

TABLE 2

|  | Comparative Example 4 | Example 1 | Example 2 |
|---|---|---|---|
| Thickness of oxide semiconductor layer (nm) | 10 | 20 | 30 |
| Average threshold voltage (V) | 3.76 | 1.76 | 1.45 |
| Distribution of threshold voltage (V) | 3.84 | 1.39 | 0.74 |
| PBTS (V) | 4.17 | 2.10 | 1.75 |

Referring to FIGS. 13, 14, and 15 and Table 2, a distribution of the threshold voltage $V_{th}$ of the thin-film transistor according to Comparative Example 4 is large, whereby uniformity of the threshold voltage $V_{th}$ of the thin-film transistor is low. Consequently, the driving properties of the thin-film transistor according to Comparative Example 4 are not good. In addition, the PBTS of the thin-film transistor according to Comparative Example 4 is large, whereby the reliability of the thin-film transistor is not good.

In contrast, a distribution of the threshold voltage $V_{th}$ of each of the thin-film transistors according to Examples 1 and 2 is small, whereby each of the thin-film transistors has excellent driving properties. In addition, the PBTS of each of the thin-film transistors according to Examples 1 and 2 is small, whereby the reliability of each of the thin-film transistors is excellent.

Evaluation of Deposition Temperature and Heat Treatment Temperature

In order to confirm the properties of the oxide semiconductor layer 120 based on deposition temperature and heat treatment temperature, oxide semiconductor layer samples, each composed of indium (In), gallium (Ga), zinc (Zn), and tin (Sn) mixed at a ratio of 4:1:4:1 (based on the number of atoms) and having a thickness of 30 nm, were manufactured. At this time, the deposition temperature for forming the oxide semiconductor layer 120 and the heat treatment temperature after deposition were adjusted as shown in Table 3 in order to manufacture oxide semiconductor layer samples S11, S12, S13, S14, S15, and S16.

TABLE 3

|  | S11 | S12 | S13 | S14 | S15 | S16 |
|---|---|---|---|---|---|---|
| Deposition temperature (° C.) | Room temperature | Room temperature | 100 | 150 | 200 | 250 |
| Heat treatment temperature (° C.) | 350 | 400 | 400 | 400 | 400 | 400 |

Figure 16:
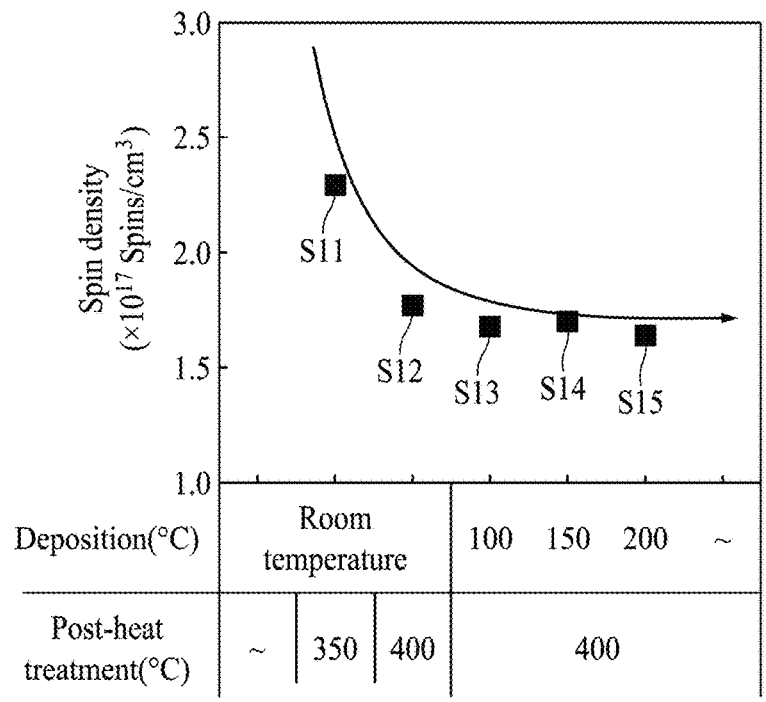
FIG. 16 is a view showing the results of measurement of the spin density of oxide semiconductor layer samples.
Figure 17:
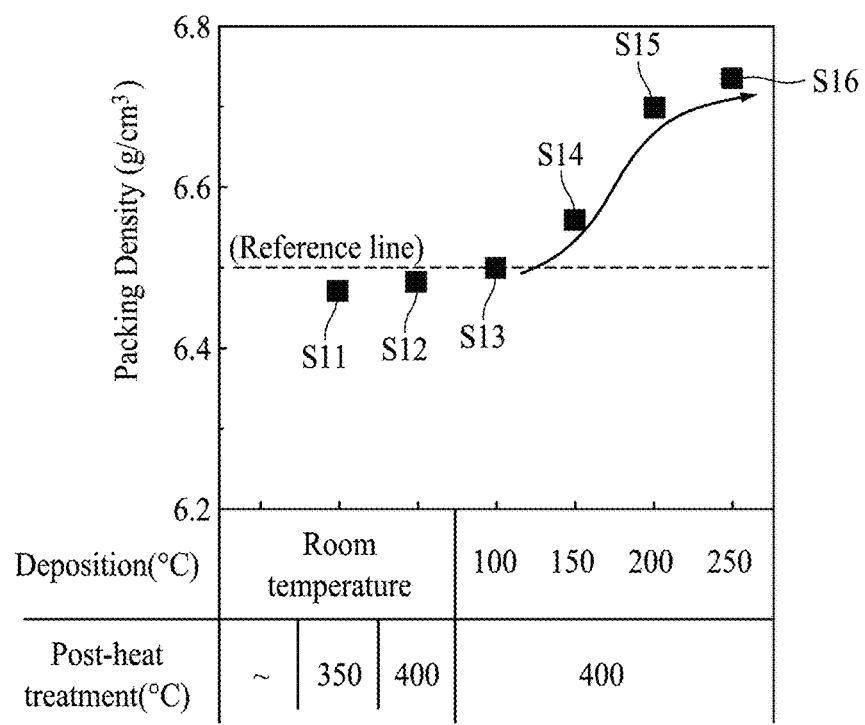
FIG. 17 is a view showing the results of measurement of the packing density of oxide semiconductor layer samples.

The spin density of the oxide semiconductor layer samples S11, S12, S13, S14, and S15 was measured, and the packing density (or the volume density) of the oxide semiconductor layer samples S11, S12, S13, S14, S15, and S16 was measured. FIG. 16 is a view showing the results of measurement of the spin density of the oxide semiconductor layer samples, and FIG. 17 is a view showing the results of measurement of the packing density of the oxide semiconductor layer samples. In FIGS. 16 and 17, the term "deposition (° C.)" indicates the deposition temperature, and the term "post-heat treatment (° C.)" indicates the heat treatment temperature after deposition.

Referring to FIG. 16, the oxide semiconductor layer sample S11, which was formed by deposition at room temperature (30° C.±20° C.) and was heat-treated at a temperature of 300° C. or higher, more specifically at a temperature of 350° C., had a spin density of more than $2.0 \times 10^{17}$ spins/cm³. The spin density is a criterion based on which the defect density of the oxide semiconductor layer 120 may be determined. The defect density is a measure of the extent of defects of atoms in the oxide semiconductor layer 120. For example, the defect density may correspond to a degree of defect of oxygen (O) atoms. The oxide semiconductor layer sample S11, which has a spin density of more than $2.0 \times 10^{17}$ spins/cm³, may become a conductor due to the defect of oxygen atoms.

Referring to FIG. 17, each of the oxide semiconductor layer samples S11, S12, and S13, each of which was formed by deposition at a temperature of lower than 150° C., has a packing density of less than 6.5 g/cm³. In the case in which the oxide semiconductor layer 120 has a packing density of less than 6.5 g/cm³, a defect of atoms may be caused, whereby a channel region of the oxide semiconductor layer 120 may become a conductor.

In contrast, it can be seen that each of the oxide semiconductor layer samples S14, S15, and S16, each of which was formed by deposition at a temperature of 150° C. or higher and was heat-treated at a temperature of 400° C., has a spin density of $2.0 \times 10^{17}$ spins/cm³ or less and a packing density of 6.5 g/cm³ or more.

FIGS. 18A to 18E are transmission electron microscope (TEM) photographs of the respective oxide semiconductor layer samples. More specifically, FIGS. 18A, 18B, 18C, 18D, and 18E are transmission electron microscope (TEM) photographs of the oxide semiconductor layer samples S12, S13, S14, S15, and S16, respectively. The crystallinity of the oxide semiconductor layer samples may be confirmed using the transmission electron microscope (TEM) photographs.

Figure 18A:
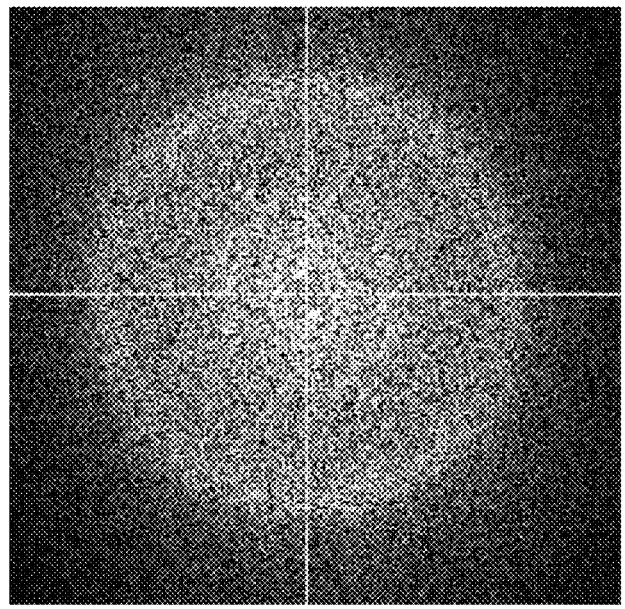
FIGS. 18A to 18E are transmission electron microscope (TEM) photographs of oxide semiconductor layer samples.
Figure 18B:
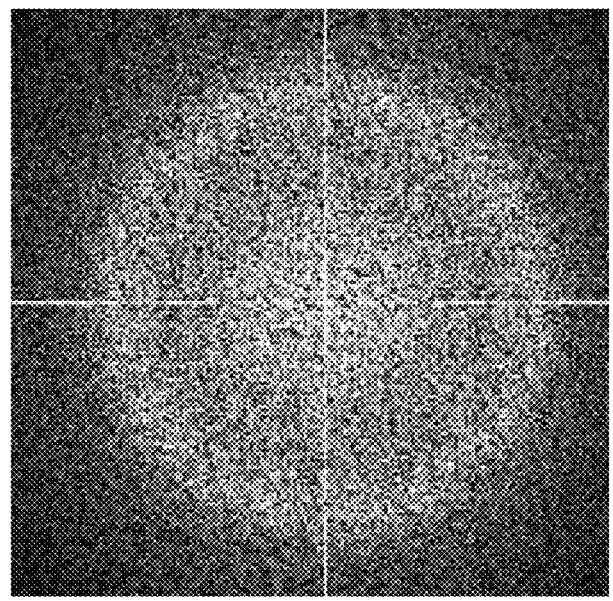
Figure 18C:
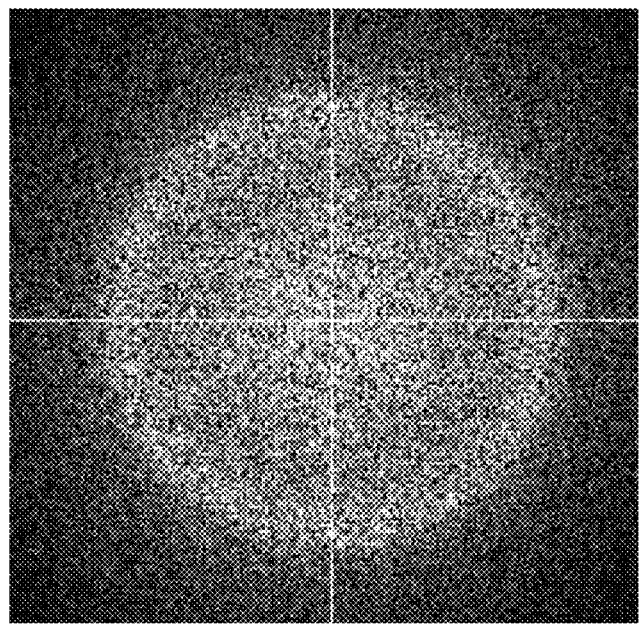
Figure 18D:
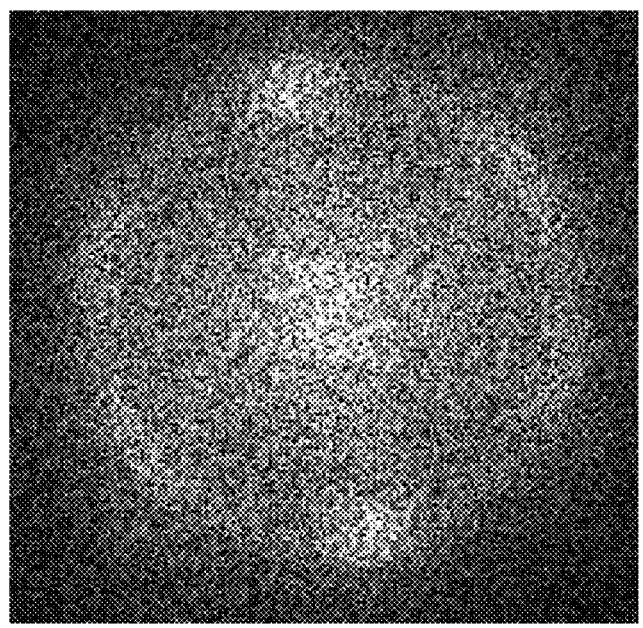
Figure 18E:
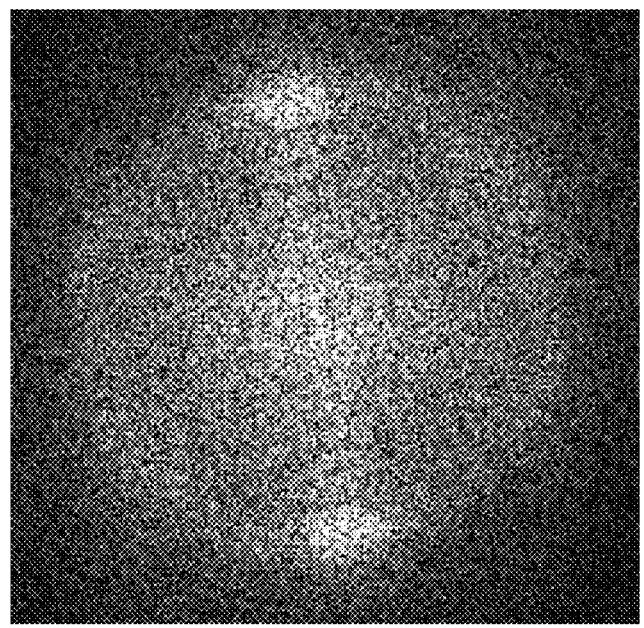

Referring to FIGS. 18D and 18E, it can be seen that each of the oxide semiconductor layer samples S15 and S16 has C-axis-oriented crystallinity. In addition, referring to FIG. 18C, it can be seen that crystallinity starts to occur in the oxide semiconductor layer sample S14 along the C-axis direction. That is, an oxide semiconductor layer 120 formed by deposition at a temperature of 150° C. or higher and heat-treated at a temperature of 400° C. may have C-axis-oriented crystallinity. In contrast, it can be seen that each of the oxide semiconductor layer samples S12 and S13 has no C-axis-oriented crystallinity.

Specifically, each of the oxide semiconductor layer samples S14, S15, and S16 according to the embodiment of the present disclosure has C-axis-oriented crystallinity. Here, the C axis faces a direction that is approximately perpendicular to the surface of the oxide semiconductor layer 120 (a normal line). An oxide semiconductor layer 120 having crystallinity has lower defect density than an oxide semiconductor layer having no crystallinity, whereby a reduction in the mobility of the oxide semiconductor layer 120 is restrained.

FIG. 19 is a view showing the results of analysis of X-ray diffraction (XRD) of the oxide semiconductor layer 120.

More specifically, FIG. 19 is a view showing the results of analysis of X-ray diffraction (XRD) of the oxide semiconductor layer sample S15. Referring to FIG. 19, a peak appears in the vicinity of a diffraction angle (2θ) of 32 degrees. The peak in the vicinity of the diffraction angle (2θ) of 32 degrees corresponds to C-axis-oriented crystallinity. The fluctuation in the driving properties of a thin-film transistor 100 including an oxide semiconductor layer 120 that exhibits such crystallinity due to the irradiation of visible rays or ultraviolet rays is prevented or restrained.

Figure 20:
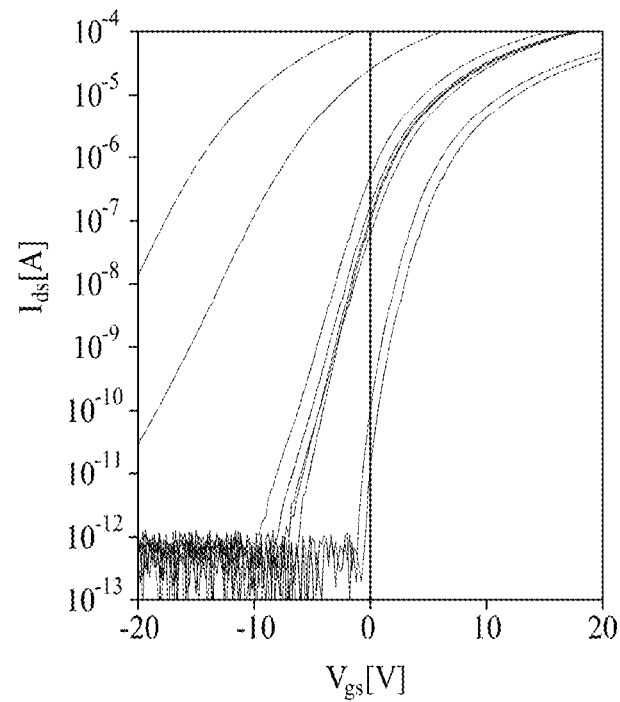
FIGS. 20 and 21 are views showing the results of measurement of the threshold voltage of thin-film transistors manufactured using oxide semiconductor layer samples.
Figure 21:
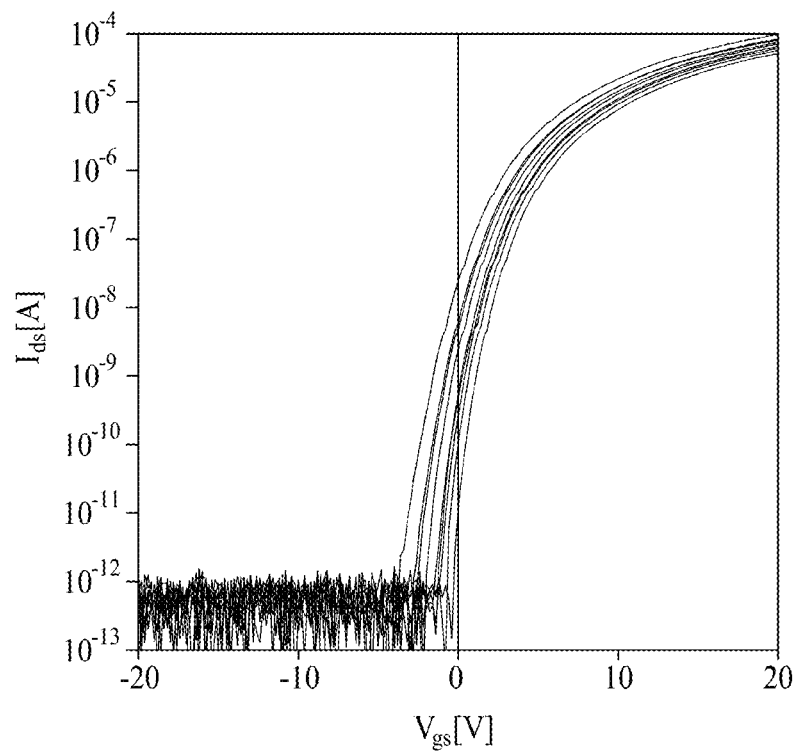

FIGS. 20 and 21 are views showing the results of measurement of the threshold voltage $V_{th}$ of thin-film transistors manufactured using the oxide semiconductor layer samples. Specifically, FIG. 20 is a graph showing the threshold voltage $V_{th}$ of a thin-film transistor manufactured using the oxide semiconductor layer sample S12, and FIG. 21 is a graph showing the threshold voltage $V_{th}$ of a thin-film transistor manufactured using the oxide semiconductor layer sample S15.

After thin-film transistors each having the structure of FIG. 1 were manufactured using the oxide semiconductor layer samples S12 and S15 according to the method disclosed in Comparative Example 1, the drain current $I_{ds}$ of the thin-film transistors was measured while a gate voltage $V_{gs}$ ranging from −20 V to +20 V was applied in order to measure the threshold voltage $V_{th}$ of the thin-film transistors. At this time, the voltage between the source electrode 130 and the drain electrode 140 was maintained at 10 V. The threshold voltage $V_{th}$ of the thin-film transistors was measured nine times.

Referring to FIG. 20, the distribution of the threshold voltage $V_{th}$ of the thin-film transistor manufactured using the oxide semiconductor layer sample S12 is large, whereby it is difficult to use the thin-film transistor as a device. In contrast, referring to FIG. 21, it can be seen that the thin-film transistor manufactured using the oxide semiconductor layer sample S15 exhibits good transistor properties.

Evaluation of the Properties of Oxide Semiconductor Layer Based on the Content of Tin (Sn)

In order to confirm the properties of the oxide semiconductor layer 120 based on the content of tin (Sn), oxide semiconductor layer samples S21, S22, S23, S24, and S25, each including indium (In), gallium (Ga), and zinc (Zn) mixed at a ratio of 4:1:4 (based on the number of atoms) and having the ratio (Sn/In) of tin (Sn) to indium (In) shown in Table 4, were manufactured. In Table 4, the ratio (Sn/In) of tin (Sn) to indium (In) is expressed as a percent (%). The ratio expressed as a percent (%) may be obtained from Equation 1 below.

$$\text{Sn/In ratio (\%)} = [(\text{the number of atoms in Sn})/(\text{the number of atoms in In})] \times 100 \quad \text{[Equation 1]}$$

TABLE 4

|  | S21 | S22 | S23 | S24 | S25 |
|---|---|---|---|---|---|
| Sn/In ratio (A) | 0 | 10.8 | 23.1 | 56.8 | 100 |
| In:Ga:Zn | 4:1:4 | 4:1:4 | 4:1:4 | 4:1:4 | 4:1:4 |

Figure 22:
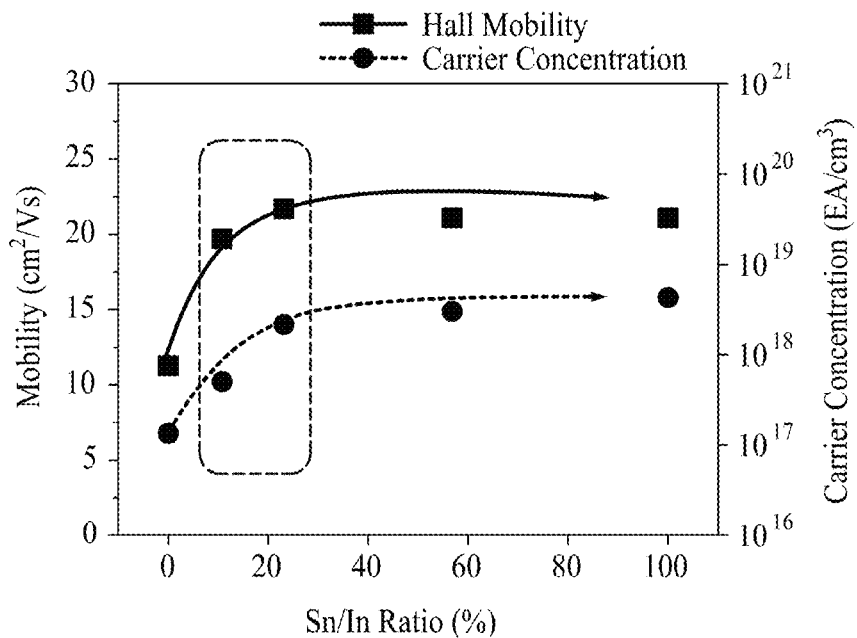
FIG. 22 is a view showing the results of the mobility and carrier concentration of oxide semiconductor layer samples.

FIG. 22 is a view showing the results of the mobility and carrier concentration of the oxide semiconductor layer samples. Specifically, the mobility and carrier concentration of the oxide semiconductor layer samples S21, S22, S23, S24, and S25 were measured. The results are shown in FIG. 22.

Referring to FIG. 22, in the case in which the ratio (Sn/In) of tin (Sn) to indium (In) is less than 10%, the mobility of the oxide semiconductor layer 120 is less than 18 cm$^2$/V·s, and the carrier concentration of the oxide semiconductor layer 120 is less than $5 \times 10^{17}$ EA/cm$^3$. In addition, it can be seen that even when the ratio (Sn/In) of tin (Sn) to indium (In) is more than 25%, the mobility and the carrier concentration of the oxide semiconductor layer 120 are not increased any further.

Figure 23:
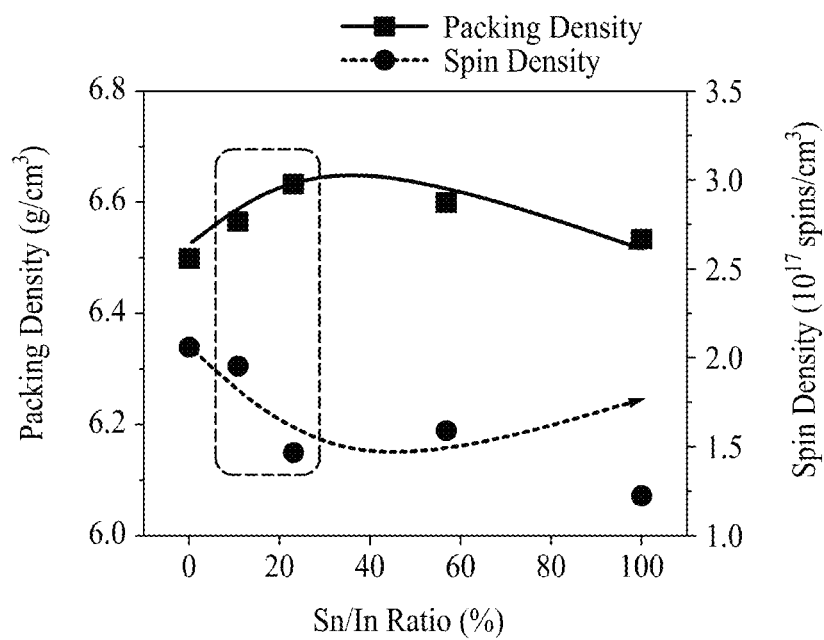
FIG. 23 is a view showing the results of measurement of the packing density and the spin density of oxide semiconductor layer samples.

FIG. 23 is a view showing the results of measurement of the packing density and the spin density of the oxide semiconductor layer samples. Specifically, the packing density and the spin density of the oxide semiconductor layer samples S21, S22, S23, S24, and S25 were measured. The results are shown in FIG. 23.

Referring to FIG. 23, the packing density of each of the oxide semiconductor layer samples S22 and S23, in each of which the ratio (Sn/In) of tin (Sn) to indium (In) ranges from 10 to 25%, is 6.5 g/cm$^3$ or more. In the case in which the ratio (Sn/In) of tin (Sn) to indium (In) is decreased to less than 10% (S21), the packing density of the oxide semiconductor layer 120 is reduced and the spin density of the oxide semiconductor layer 120 is increased. In addition, it can be seen that when the ratio (Sn/In) of tin (Sn) to indium (In) is increased to more than 25% (S24 and S25), the packing density of the oxide semiconductor layer 120 is reduced and the spin density of the oxide semiconductor layer 120 is increased.

Figure 24:
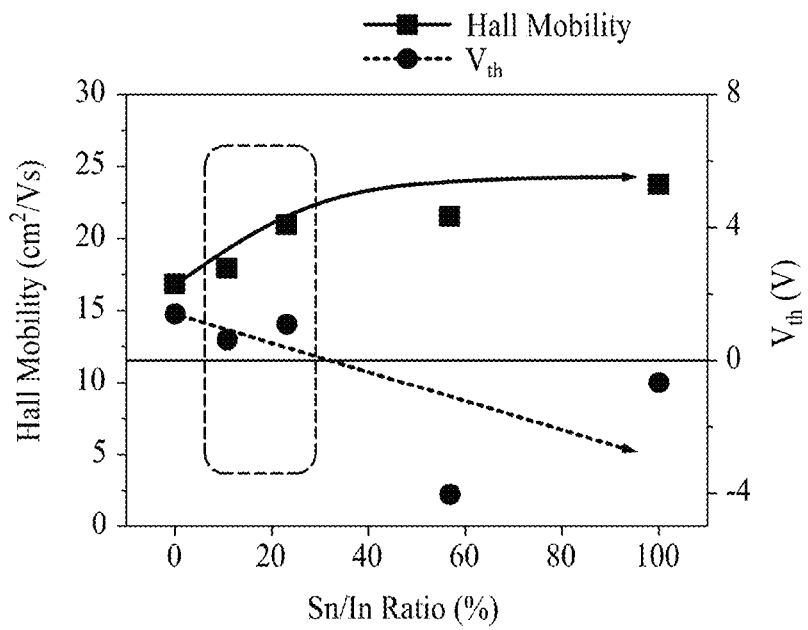
FIG. 24 is a view showing the results of measurement of the mobility and the threshold voltage of thin-film transistors.

FIG. 24 is a view showing the results of measurement of the mobility and the threshold voltage $V_{th}$ of thin-film transistors. Specifically, FIG. 24 is a view showing the results of measurement of the mobility and the threshold voltage $V_{th}$ of thin-film transistors including the oxide semiconductor layer samples manufactured according to the composition shown in Table 4.

Referring to FIG. 24, in the case in which the ratio (Sn/In) of tin (Sn) to indium (In) is less than 10%, the mobility of the oxide semiconductor layer 120 is decreased to less than 18 cm$^2$/V·s, and the threshold voltage $V_{th}$ of the oxide semiconductor layer 120 is increased. In addition, even when the ratio (Sn/In) of tin (Sn) to indium (In) is more than 25%, the mobility of the oxide semiconductor layer 120 is not increased, whereas the threshold voltage $V_{th}$ of the oxide semiconductor layer 120 is decreased to a negative (−) value.

Figure 25:
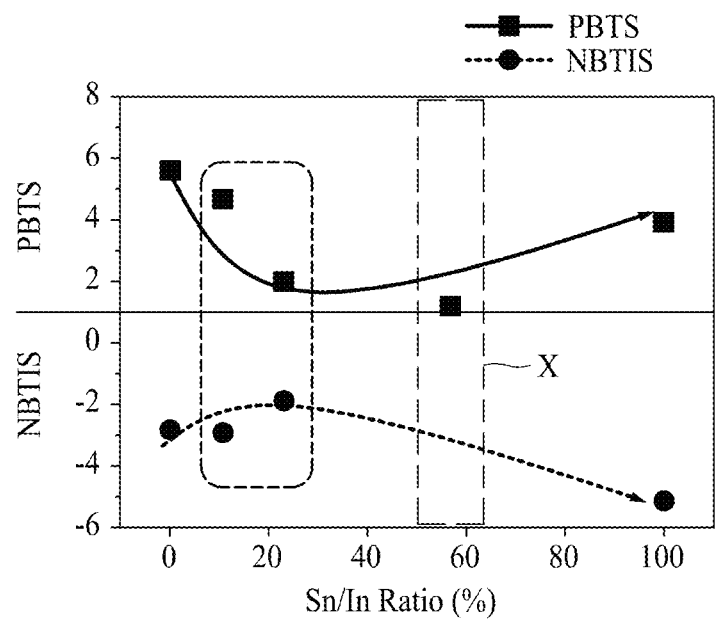
FIG. 25 is a view showing the results of measurement of the positive bias temperature stress (PBTS) and the negative bias temperature illuminance stress (NBTIS) of thin-film transistors.
Figure 26:
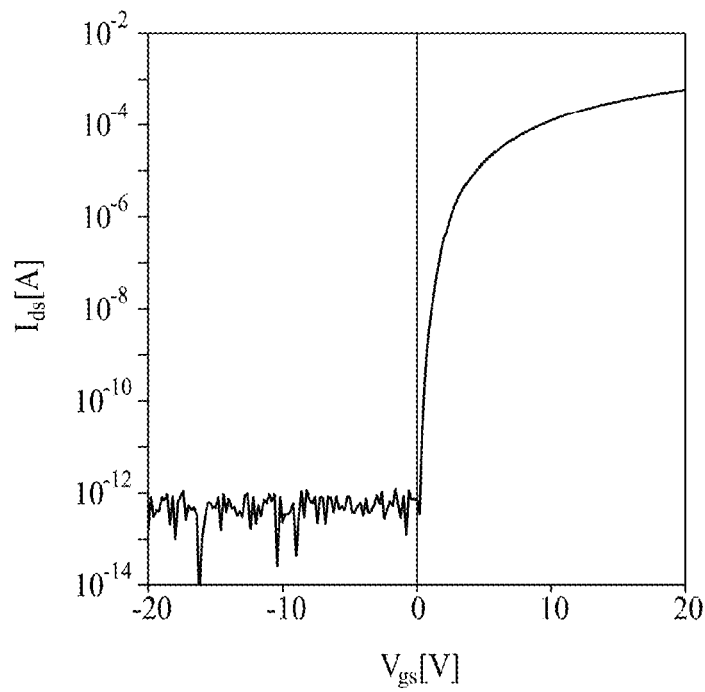
FIGS. 26, 27, 28, 29, and 30 are views showing the results of measurement of the threshold voltage of thin-film transistors including oxide semiconductor layers manufactured according to the composition shown in Table 4.
Figure 27:
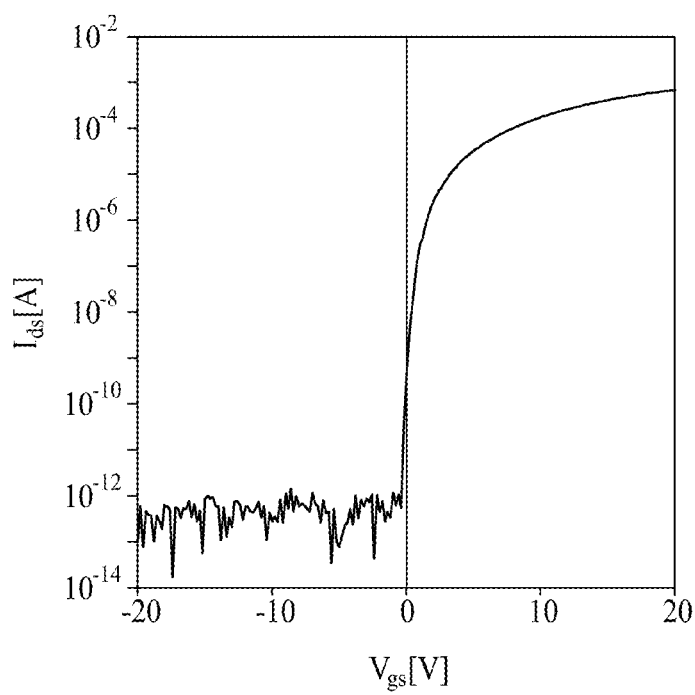
Figure 28:
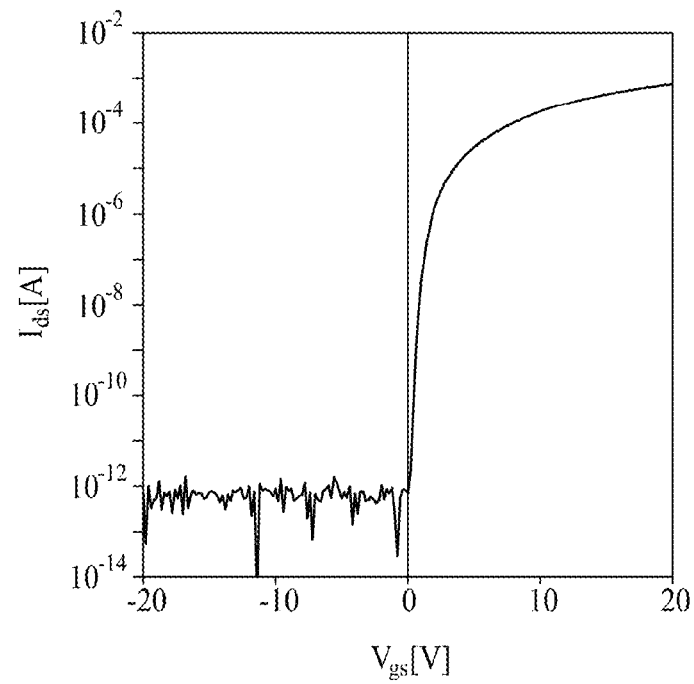
Figure 29:
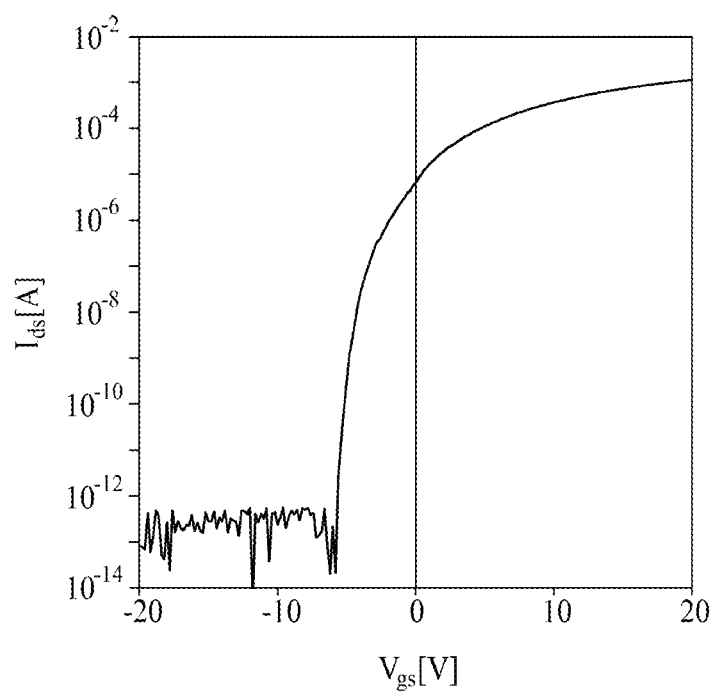
Figure 30:
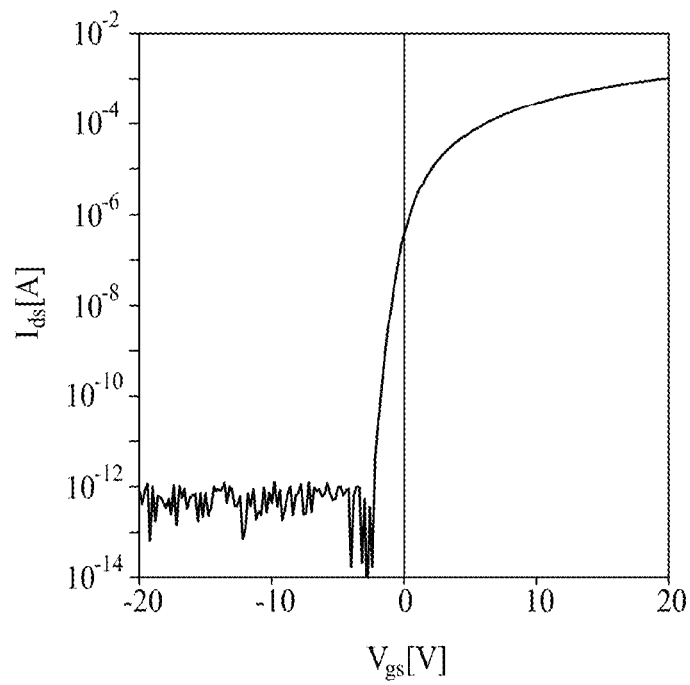

FIG. 25 is a view showing the results of measurement of the PBTS and the NBTIS of thin-film transistors.

Referring to FIG. 25, the PBTS of a thin-film transistor including an oxide semiconductor layer configured such that the ratio (Sn/In) of tin (Sn) to indium (In) is less than 10% is increased, and the absolute value of the NBTIS of the thin-film transistor is also increased. In addition, in the case in which the thin-film transistor includes an oxide semiconductor layer configured such that the ratio (Sn/In) of tin (Sn) to indium (In) is more than 25%, the PBTS of the thin-film transistor is increased, and the absolute value of the NBTIS of the thin-film transistor is also increased again. In the case in which the thin-film transistor includes an oxide semiconductor layer configured such that the ratio (Sn/In) of tin (Sn) to indium (In) is 56.8%, which corresponds to the oxide semiconductor layer sample S24, the NBTIS of the thin-film transistor suffered abnormal retrogression, whereby it was not possible to measure the NBTIS of the thin-film transistor (X region).

FIGS. 26, 27, 28, 29, and 30 are views showing the results of measurement of the threshold voltage $V_{th}$ of thin-film transistors including oxide semiconductor layers 120 manufactured according to the composition shown in Table 4.

Meanwhile, Table 5 shows the results of measurement of the threshold voltage $V_{th}$, the mobility, the s-factor, the PBTS, and the NBTIS of thin-film transistors including oxide semiconductor layers 120 manufactured according to the composition shown in Table 4.

TABLE 5

| | S21 | S22 | S23 | S24 | S25 |
|---|---|---|---|---|---|
| Threshold voltage $V_{th}$ (V) | 1.42 | 0.64 | 1.11 | −4.01 | −0.65 |
| Mobility ($cm^2/V \cdot s$) | 16.9 | 18.0 | 21.0 | 21.6 | 23.8 |
| S-factor | 0.138 | 0.134 | 0.155 | 0.279 | 0.310 |
| PBTS (V) | 5.63 | 4.68 | 2.01 | 1.21 | 3.93 |
| NBTIS (V) | −2.81 | −2.9 | −1.87 | Abnormal retrogression | −5.12 |

The s-factor (sub-threshold swing) indicates the reciprocal of a slope within a period in which the thin-film transistor operates as a switching device in a graph showing the properties of drain current to gate voltage. The s-factor measured using FIGS. 26, 27, 28, 29, and 30 is shown in Table 5. Referring to Table 5, it can be seen that in the case in which the ratio (Sn/In) of tin (Sn) to indium (In) is more than 25%, the s-factor of the thin-film transistor is increased, whereby the switching property of the thin-film transistor is reduced.

In order to test an improvement in the stability of the oxide semiconductor layer 120 due to plasma treatment, three thin-film transistors, each of which includes an oxide semiconductor layer 120 having the composition of the oxide semiconductor layer sample S23 shown in Table 4, were manufactured (S31, S32, and S33), and then the oxide semiconductor layer 120 was plasma-treated using $N_2O$. The intensity of plasma treatment is shown in Table 6 below. In addition, an insulation layer made of a silicon oxide ($SiO_{2-x}H_x$, where x is 0.5 or more) having excessive vacancy of oxygen was formed on the plasma-treated oxide semiconductor layer 120 in order to confirm the driving properties of the thin-film transistors under adverse conditions.

Subsequently, a distribution of the threshold voltage $V_{th}$, the mobility, the s-factor, the PBTS, and the NBTIS of each of the thin-film transistors S31, S32, and S33 were measured. The results are shown in Table 6.

TABLE 6

| | S31 | S32 | S33 |
|---|---|---|---|
| Plasma intensity ($kW/m^2$) | 1.15 | 2.01 | 2.898 |
| Distribution of threshold voltage (V) | 9.43 | 0.88 | 1.32 |
| Mobility ($cm^2/V \cdot s$) | Unmeasurable | 30.3 | 25.3 |
| S-factor | 1.42 | 0.58 | 0.62 |
| PBTS (V) | Unmeasurable | 1.86 | 3.23 |
| NBTIS (V) | Unmeasurable | −4.09 | −4.08 |

Figure 31:
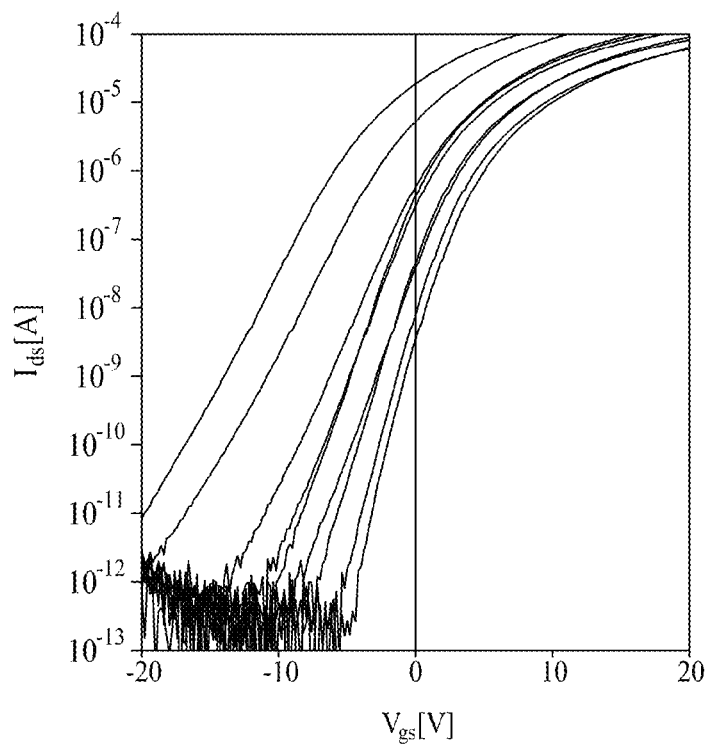
FIGS. 31, 32, and 33 are views showing the results of measurement of the threshold voltage of thin-film transistors.
Figure 32:
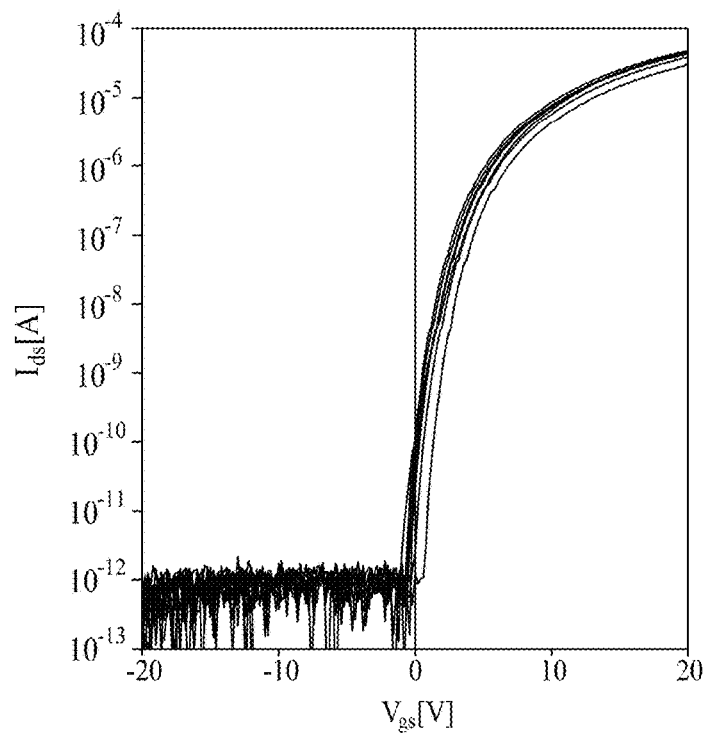
Figure 33:
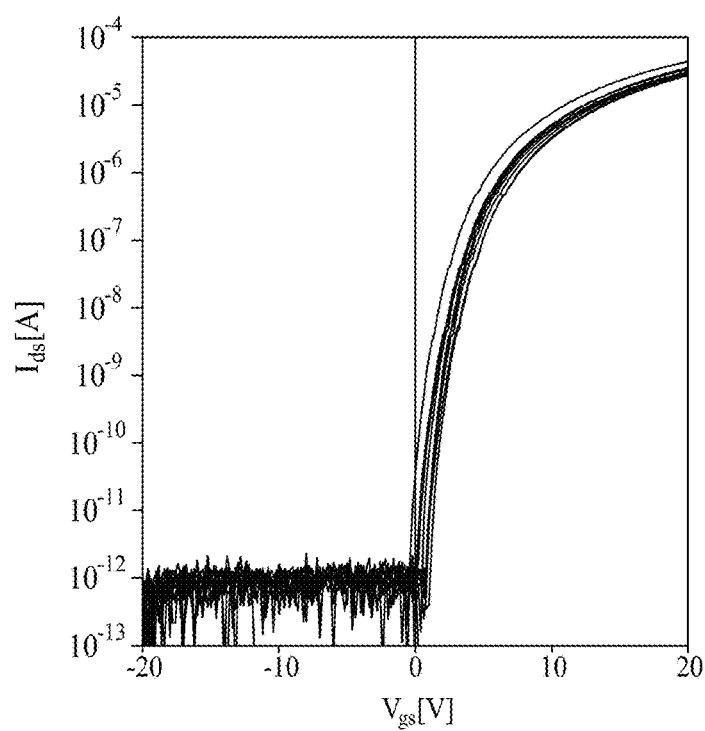

FIGS. 31, 32, and 33 are views showing the results of measurement of the threshold voltage of the thin-film transistors S31, S32, and S33, respectively.

The results of an adverse-condition test in which a silicon oxide having excessive vacancy of oxygen was formed on the oxide semiconductor layer 120 reveal that in the case in which the oxide semiconductor layer 120 is plasma-treated using $N_2O$ while energy of an amount less than 2.0 $kW/m^2$ is applied, a distribution of the threshold voltage $V_{th}$ of the thin-film transistor is increased, the s-factor of the thin-film transistor is increased, and the behavior of the thin-film transistor is unstable, whereby it is not possible to measure the PBTS or the NBTIS of the thin-film transistor.

In contrast, in the case in which the oxide semiconductor layer 120 is plasma-treated using $N_2O$ while energy of an amount of 2.0 $kW/m^2$ or more is applied thereto, it can be seen that good driving properties of the thin-film transistor are maintained even when a silicon oxide having excessive vacancy of oxygen under adverse conditions is formed on the oxide semiconductor layer 120. It is generally known that the s-factor of a thin-film transistor is reduced when plasma treatment is performed using $N_2O$. For a thin-film transistor according to an embodiment of the present disclosure, however, it can be seen that a good s-factor of the thin-film transistor can be maintained when plasma treatment is performed using $N_2O$.

In the case in which plasma treatment is performed using $N_2O$ while energy of an amount more than 2.5 $kW/m^2$ is applied, however, the PBTS of the thin-film transistor is increased, whereby the reliability of the thin-film transistor is reduced.

For this reason, plasma treatment energy may be adjusted to fall within a range of 2.0 to 2.5 $kW/m^2$.

As is apparent from the above description, a thin-film transistor according to an embodiment of the present disclosure includes an oxide semiconductor layer that includes indium (In), gallium (Ga), zinc (Zn), and tin (Sn) mixed in a predetermined ratio and has a predetermined thickness, whereby the thin-film transistor exhibits excellent mobility, excellent driving properties, and excellent ability to withstand heat or light. In addition, according to an embodiment of the present disclosure, the oxide semiconductor layer is formed by deposition and heat treatment at a predetermined temperature, whereby the oxide semiconductor layer exhibits excellent mobility and crystallinity. Consequently, a reduction in the reliability of the oxide semiconductor layer is prevented.

A display apparatus according to another embodiment of the present disclosure includes the thin-film transistor described above, whereby the display apparatus exhibits excellent driving properties.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display apparatus, comprising:
a substrate;
a thin-film transistor disposed on the substrate; and
a first electrode electrically connected to the thin-film transistor,
wherein the thin-film transistor includes an oxide semiconductor layer including indium (In), gallium (Ga), zinc (Zn), tin (Sn), and oxygen (O),
wherein a content of In in the oxide semiconductor layer is greater than a content of Ga,
wherein a content of In in the oxide semiconductor layer is greater than a content of Sn,
wherein the oxide semiconductor layer has a first layer and a second layer, the second layer being stacked on the first layer,
wherein an O content of the second layer is greater than an O content of the first layer,
wherein the content of In/Zn is equal to or greater than 0.9, and
wherein the content of In/Zn is equal to or less than 1.1.

2. The display apparatus according to claim 1, wherein a content ratio (Sn/In) of Sn to In is 0.1 to 0.25.

3. The display apparatus according to claim 1, wherein the content of In is substantially equal to a content of Zn.

4. The display apparatus according to claim 1, wherein the oxide semiconductor layer has a thickness of 20 nm or more.

5. The display apparatus according to claim 1, wherein the oxide semiconductor layer has a mobility of 18 cm$^2$/V·s or more.

6. The display apparatus according to claim 1, wherein the oxide semiconductor layer has a carrier concentration of 5×10$^{17}$ EA/cm$^3$ or more.

7. The display apparatus according to claim 1, wherein the oxide semiconductor layer has a packing density of 6.5 g/cm$^3$ or more.

8. The display apparatus according to claim 1, wherein the oxide semiconductor layer has a spin density of 2.0×10$^{17}$ spins/cm$^3$ or less.

9. The display apparatus according to claim 1, the thin-film transistor further comprising a gate electrode, wherein the first layer is disposed closer to the gate electrode than the second layer.

10. The display apparatus according to claim 1, wherein a content ratio of each of In, Ga, Zn, and Sn based on total amount of In, Ga, Zn, and Sn is substantially same in the first layer and the second layer.

11. The display apparatus according to claim 1, wherein the second layer has a thickness equivalent to 5 to 20% of a thickness of the oxide semiconductor layer.

12. The display apparatus according to claim 1, the thin-film transistor further comprising a source electrode and a drain electrode electrically connected to the oxide semiconductor layer, the source electrode and the drain electrode being disposed so as to be spaced apart from each other,
wherein a thickness of a region of the second layer that does not overlap the source electrode and the drain electrode is greater than a thickness of a region of the second layer that overlaps at least one of the source electrode or the drain electrode.

13. The display apparatus according to claim 1, wherein the content of In is 1.5 to 5 times the content of Ga.

14. A display apparatus, comprising:
a substrate;
a thin-film transistor disposed on the substrate; and
a first electrode electrically connected to the thin-film transistor,
wherein the thin-film transistor includes an oxide semiconductor layer including indium (In), gallium (Ga), zinc (Zn), tin (Sn), and oxygen (O),
wherein the content of In is substantially equal to the content of Zn,
wherein the content of In is greater than the content of Ga,
wherein the content of In is greater than the content of Sn,
wherein the content of In/Zn is equal to or greater than 0.9, and
wherein the content of In/Zn is equal to or less than 1.1.

15. The display apparatus according to claim 14,
wherein the oxide semiconductor layer has a first layer and a second layer, the second layer being stacked on the first layer, and
wherein an O content of the second layer is greater than an O content of the first layer.

16. The display apparatus according to claim 15, the thin-film transistor further comprising a gate electrode, wherein the first layer is disposed closer to the gate electrode than the second layer.

17. The display apparatus according to claim 15, wherein a content ratio of each of In, Ga, Zn, and Sn based on total amount of In, Ga, Zn, and Sn is substantially same in the first layer and the second layer.

18. A display apparatus, comprising:
a substrate;
a thin-film transistor disposed on the substrate; and
a first electrode electrically connected to the thin-film transistor,
wherein the thin-film transistor includes an oxide semiconductor layer including indium (In), gallium (Ga), zinc (Zn), tin (Sn), and oxygen (O),
wherein the oxide semiconductor layer has a packing density of 6.5 g/cm$^3$ or more,
wherein a content of In in the oxide semiconductor layer is greater than a content of Ga,
wherein a content of In in the oxide semiconductor layer is greater than a content of Sn,
wherein the content of In/Zn is equal to or greater than 0.9, and
wherein the content of In/Zn is equal to or less than 1.1.

19. The display apparatus according to claim 18,
wherein the oxide semiconductor layer has a first layer and a second layer, the second layer being stacked on the first layer, and
wherein an O content of the second layer is greater than an O content of the first layer.

20. The display apparatus according to claim 19, wherein a content ratio of each of In, Ga, Zn, and Sn based on total amount of In, Ga, Zn, and Sn is substantially same in the first layer and the second layer.

* * * * *

UNITED STATES PATENT AND TRADEMARK OFFICE
CERTIFICATE OF CORRECTION

| | | |
|---|---|---|
| PATENT NO. | : 12,176,437 B2 | Page 1 of 1 |
| APPLICATION NO. | : 17/524255 | |
| DATED | : December 24, 2024 | |
| INVENTOR(S) | : HeeSung Lee et al. | |

It is certified that error appears in the above-identified patent and that said Letters Patent is hereby corrected as shown below:

On the Title Page

Item (54) and in the Specification Column 1, Lines 1-5 "THIN-FILM TRANSISTOR INCLUDING OXIDE SEMICONDUCTOR LAYER, METHOD OF MANUFACTURING THE SAME, AND DISPLAY APPARATUS INCLUDING THE SAME"

Should read:
--THIN-FILM TRANSISTOR INCLUDING OXIDE SEMICONDUCTOR LAYER AND DISPLAY APPARATUS INCLUDING THE SAME--

Signed and Sealed this
Twentieth Day of May, 2025

Coke Morgan Stewart
*Acting Director of the United States Patent and Trademark Office*